(12) United States Patent
Siew et al.

(10) Patent No.: US 11,335,637 B2
(45) Date of Patent: May 17, 2022

(54) SEMICONDUCTOR DEVICES AND METHODS OF MANUFACTURING SEMICONDUCTOR DEVICES

(71) Applicant: SAMSUNG ELECTRONICS CO., LTD., Suwon-si (KR)

(72) Inventors: Yong Kong Siew, Suwon-si (KR); Wei Hsiung Tseng, Seongnam-si (KR); Changhwa Kim, Hwaseong-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 13 days.

(21) Appl. No.: 16/508,555

(22) Filed: Jul. 11, 2019

(65) Prior Publication Data

US 2019/0333856 A1 Oct. 31, 2019

Related U.S. Application Data

(63) Continuation of application No. 15/493,965, filed on Apr. 21, 2017, now Pat. No. 10,396,034.

(30) Foreign Application Priority Data

Oct. 5, 2016 (KR) .......................... 10-2016-0128352

(51) Int. Cl.
*H01L 29/66* (2006.01)
*H01L 23/535* (2006.01)
(Continued)

(52) U.S. Cl.
CPC ...... *H01L 23/535* (2013.01); *H01L 21/76807* (2013.01); *H01L 21/76829* (2013.01);
(Continued)

(58) Field of Classification Search
CPC ................. H01L 23/535; H01L 23/485; H01L 21/76807; H01L 21/76829;
(Continued)

(56) References Cited

U.S. PATENT DOCUMENTS 6,177,351 B1 * 1/2001 Beratan ............... H01L 21/0332
257/E21.009
6,633,057 B2 10/2003 Kawata et al.
(Continued)

FOREIGN PATENT DOCUMENTS

CN 101345240 1/2009
CN 103178045 6/2013
(Continued)

OTHER PUBLICATIONS

Office Action dated Apr. 16, 2021 in corresponding Chinese Patent Application No. 201710749122.4, 14 pages (in Chinese).
(Continued)

*Primary Examiner* — S M Sohel Imtiaz
(74) *Attorney, Agent, or Firm* — F. Chau & Associates, LLC

(57) ABSTRACT

A semiconductor device includes a substrate having an active region, a gate structure disposed on the active region, a source/drain region disposed in the active region at a side of the gate structure, a first interlayer insulating layer and a second interlayer insulating layer sequentially disposed on the gate structure and the source/drain region with an etch stop layer interposed therebetween, a first contact plug connected to the source/drain region through the first interlayer insulating layer, a second contact plug connected to the gate structure through the first interlayer insulating layer and the second interlayer insulating layer, a first metal line disposed on the second interlayer insulating layer, and having a metal via disposed in the second interlayer insulating layer and connected to the first contact plug, and a second metal line disposed on the second interlayer insulating layer, and directly connected to the second contact plug.

16 Claims, 24 Drawing Sheets

(51) Int. Cl.
*H01L 23/485* (2006.01)
*H01L 21/768* (2006.01)
*H01L 29/06* (2006.01)
*H01L 29/417* (2006.01)
*H01L 29/78* (2006.01)
*H01L 29/165* (2006.01)
*H01L 21/285* (2006.01)

(52) U.S. Cl.
CPC .. *H01L 21/76843* (2013.01); *H01L 21/76895* (2013.01); *H01L 23/485* (2013.01); *H01L 29/0649* (2013.01); *H01L 29/41791* (2013.01); *H01L 29/66795* (2013.01); *H01L 29/785* (2013.01); *H01L 21/28518* (2013.01); *H01L 21/76805* (2013.01); *H01L 21/76831* (2013.01); *H01L 29/165* (2013.01); *H01L 29/66545* (2013.01); *H01L 29/7848* (2013.01)

(58) Field of Classification Search
CPC ......... H01L 21/76843; H01L 21/76895; H01L 29/0649; H01L 29/41791; H01L 29/66795; H01L 29/785; H01L 29/165; H01L 29/66545; H01L 29/7848
See application file for complete search history.

(56) References Cited

U.S. PATENT DOCUMENTS

| | | | |
|---|---|---|---|
| 8,017,992 B2 | 9/2011 | Kim | |
| 8,643,126 B2* | 2/2014 | Hampp | H01L 21/28518 257/412 |
| 9,275,989 B2 | 3/2016 | Yiang | |
| 9,852,947 B1* | 12/2017 | Ko | H01L 21/0337 |
| 2003/0027395 A1* | 2/2003 | Park | H01L 21/76897 438/305 |
| 2004/0046196 A1* | 3/2004 | Kim | H01L 28/65 257/296 |
| 2006/0099784 A1* | 5/2006 | Suzuki | H01L 29/66583 438/585 |
| 2007/0254473 A1* | 11/2007 | Choi | H01L 27/10855 438/637 |
| 2008/0042174 A1* | 2/2008 | Belyansky | H01L 21/76804 257/288 |
| 2009/0014796 A1* | 1/2009 | Liaw | H01L 23/528 257/347 |
| 2009/0321856 A1 | 12/2009 | Rachmady et al. | |
| 2010/0224936 A1* | 9/2010 | Hokazono | H01L 21/76834 257/368 |
| 2011/0248344 A1* | 10/2011 | Nitta | H01L 29/78612 257/347 |
| 2012/0098073 A1* | 4/2012 | Yu | H01L 23/535 257/413 |
| 2012/0104471 A1 | 5/2012 | Chang et al. | |
| 2013/0069128 A1 | 3/2013 | Okano | |
| 2013/0161722 A1* | 6/2013 | Son | H01L 29/78 257/321 |
| 2014/0017862 A1* | 1/2014 | Yu | H01L 21/28518 438/197 |
| 2015/0171206 A1* | 6/2015 | van Dal | H01L 29/4232 257/192 |
| 2015/0187702 A1 | 7/2015 | Rasheo et al. | |
| 2015/0332962 A1 | 11/2015 | Chen et al. | |
| 2016/0233164 A1 | 8/2016 | Choi et al. | |
| 2016/0322468 A1* | 11/2016 | Lu | H01L 21/76897 |
| 2016/0343660 A1* | 11/2016 | Kim | H01L 23/5226 |
| 2017/0054004 A1* | 2/2017 | Cheng | H01L 21/02178 |
| 2017/0222008 A1* | 8/2017 | Hsu | H01L 21/76889 |
| 2018/0096934 A1 | 4/2018 | Siew et al. | |

FOREIGN PATENT DOCUMENTS

| | | |
|---|---|---|
| CN | 105097470 | 11/2015 |
| CN | 105845652 | 8/2016 |
| CN | 105870167 | 8/2016 |
| KR | 1020080036700 | 4/2008 |
| KR | 1020090077275 | 7/2009 |

OTHER PUBLICATIONS

Office Action dated Mar. 23, 2022 in corresponding Chinese Patent Application No. 201710749122.4, 10 pages (in Chinese).

* cited by examiner

SEMICONDUCTOR DEVICES AND METHODS OF MANUFACTURING SEMICONDUCTOR DEVICES

CROSS-REFERENCE TO RELATED APPLICATION

This application is a continuation of U.S. application Ser. No. 15/493,965, filed on Apr. 21, 2017, which claims priority under 35 U.S.C. § 119 to Korean Patent Application No. 10-2016-0128352, filed on Oct. 5, 2016 in the Korean Intellectual Property Office, the disclosures of which are incorporated by reference herein in their entirety.

TECHNICAL FIELD

The present disclosure relates to semiconductor devices and methods of manufacturing the same.

DISCUSSION OF RELATED ART

As demands for high performance, high speed, and/or multi functioning of semiconductor devices increase, the integration degree of semiconductor devices becomes higher. When semiconductor devices having micropatterns with a high degree of integration are manufactured, the implementation of micropatterns having a microwidth or a microdistance is required. Also, to overcome the limitations of planar metal-oxide-semiconductor field-effect transistors (MOSFETs), semiconductor devices including fin field effect transistors (FinFETs), with a channel having a three-dimensional structure, have been developed.

When the size of semiconductor devices is reduced to meet the requirement of the FinFETs, an interval between contact plugs thereof may decrease, and thus short circuits between the contact plugs may occur. In addition, metal vias connecting metal lines to contact plugs may cause contact defects such as via open.

SUMMARY

Example embodiments of the present disclosure provide a semiconductor device that may be scaled down, while preventing short circuits between contact plugs, and a method of manufacturing the semiconductor device.

According to an example embodiment of the present disclosure, a semiconductor device may include: a substrate having an active region; a gate structure disposed on the active region; a source/drain region disposed in the active region at a side of the gate structure; a first interlayer insulating layer and a second interlayer insulating layer sequentially disposed on the gate structure and the source/drain region; a first contact plug connected to the source/drain region through the first interlayer insulating layer; a second contact plug connected to the gate structure through the first interlayer insulating layer and the second interlayer insulating layer; a first metal line disposed on the second interlayer insulating layer, and having a metal via disposed in the second inter layer insulating layer and connected to the first contact plug; and a second metal line-disposed on the second interlayer insulating layer, and directly connected to the second contact plug.

According to an example embodiment of the present disclosure, a semiconductor device may include: a substrate; a gate structure disposed on the substrate; a source/drain region disposed at a side of the gate structure; a first contact, plug connected to the source/drain region, and formed in a substantially vertical direction from an upper surface of the substrate; a second contact plug connected to the gate structure, and formed in a substantially vertical direction from the upper surface of the substrate; and a first metal line and a second metal line connected to the first contact plug and the second contact plug, respectively, and disposed on a first level. An upper surface of one of the first contact plug and the second contact plug may be disposed on the first level and directly connected to one of the first metal line and the second metal line, and an upper surface of the other one of the first contact plug and the second contact plug may be disposed on a second level, lower than the first level, and connected to the other one of the first metal line and the second metal line by a metal via.

According to an example embodiment of the present disclosure, a method of manufacturing a semiconductor device may include: preparing a substrate having a gate structure and a source/drain region formed at a side of the gate structure; forming a first interlayer insulating layer over the gate structure and the source/drain region on the substrate; forming a first contact plug connected to the source/drain region through the first interlayer insulating layer; forming a second interlayer insulating layer on the first interlayer insulating layer and the first contact plug; forming a second contact plug connected to the gate structure through the first interlayer insulating layer and the second interlayer insulating layer; and forming a first metal line connected to the first contact plug through a metal via formed in the second interlayer insulating layer, and a second metal line connected to the second contact plug on the second interlayer insulating layer.

According to an example embodiment of the present disclosure, a semiconductor device may include: a substrate; a gate structure and a source/drain region disposed on the substrate; a first interlayer insulating layer disposed over the gate structure and the source/drain region; a first contact plug disposed in the first inter layer insulating layer to connect the source/drain region, with a top surface of the first contact plug and a top surface of the first interlayer insulating layer being at a first level; a second interlayer insulating layer disposed on the first interlayer insulating layer; a second contact plug disposed in the first and second interlayer insulating layers to connect the gate structure, with a top surface of the second contact plug and a top surface of the second interlayer insulating layer being at a second level, higher than the first level; a first metal line disposed on the second interlayer insulating layer, the first metal line including a metal via disposed in the second interlayer insulating layer to connect the first contact plug, with a top surface of the metal via being at the second level; and a second metal line disposed on the second interlayer insulating layer to directly connect the second contact plug at the second level.

BRIEF DESCRIPTION OF THE DRAWINGS

The above, and other features of: the present disclosure will be more clearly understood from the following detailed description taken in conjunction with the accompanying drawings, in which.

Figure 1:
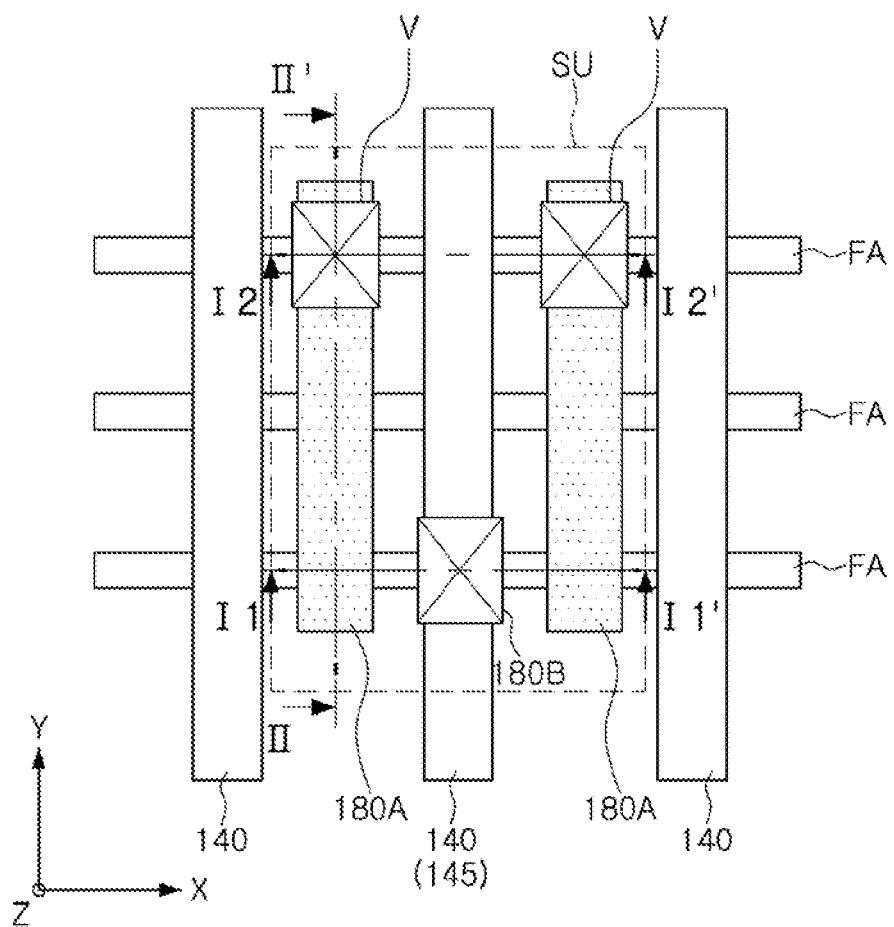
FIG. 1 is a layout of a semiconductor device according to an example embodiment of the present disclosure.

Since the drawings in FIGS. 1-20 are intended for illustrative purposes, the elements in the drawings are not necessarily drawn to scale. For example, some of the elements may be enlarged or exaggerated for clarity purpose.

DETAILED DESCRIPTION OF THE EMBODIMENTS

Figure 2A:
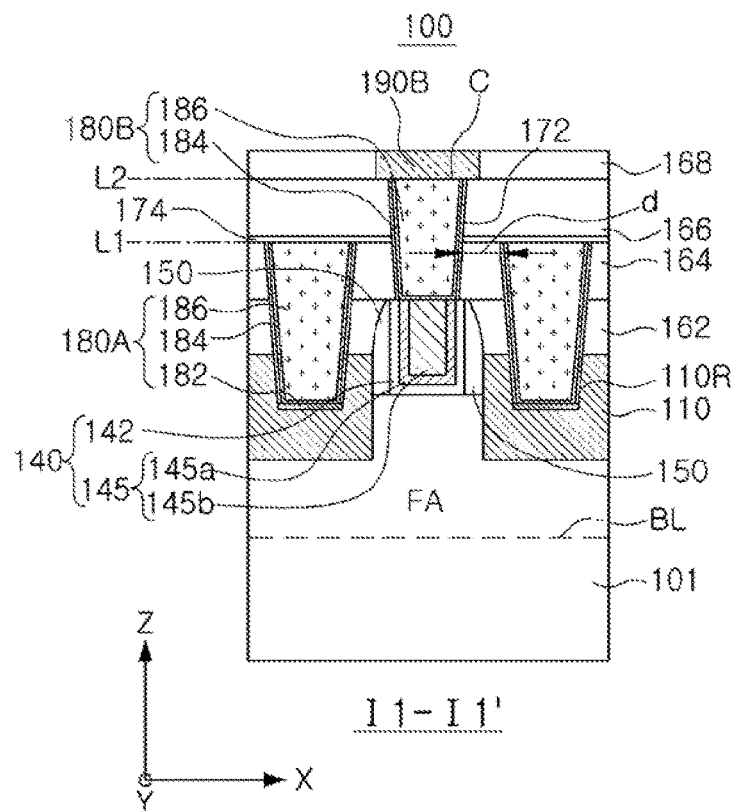
FIGS. 2A and 2B are cross-sectional views taken along lines I1-I1' and I2-I2' of FIG. 1, respectively.
Figure 2B:
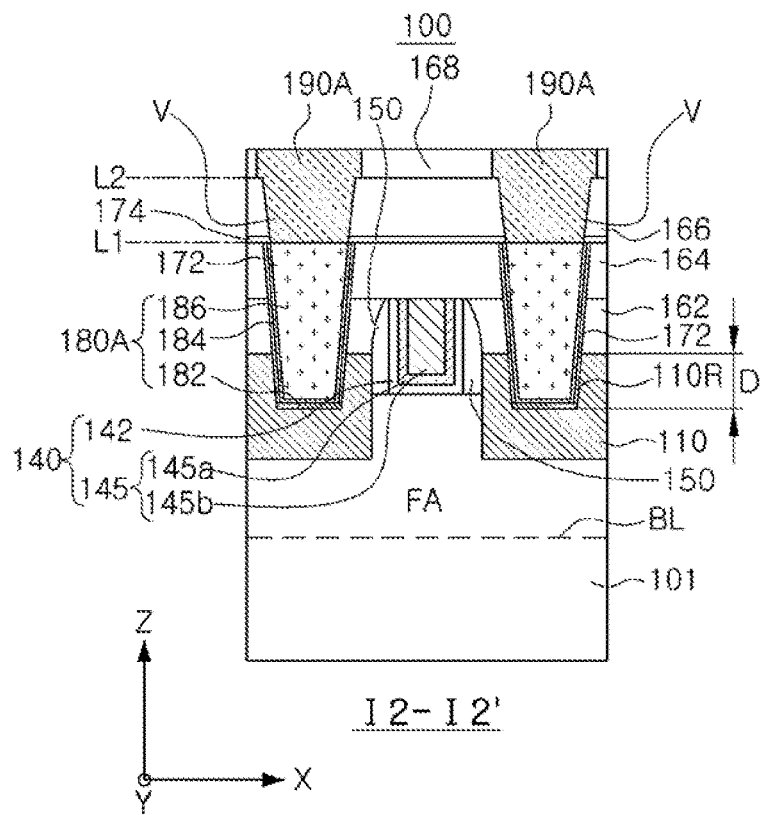
Figure 2C:
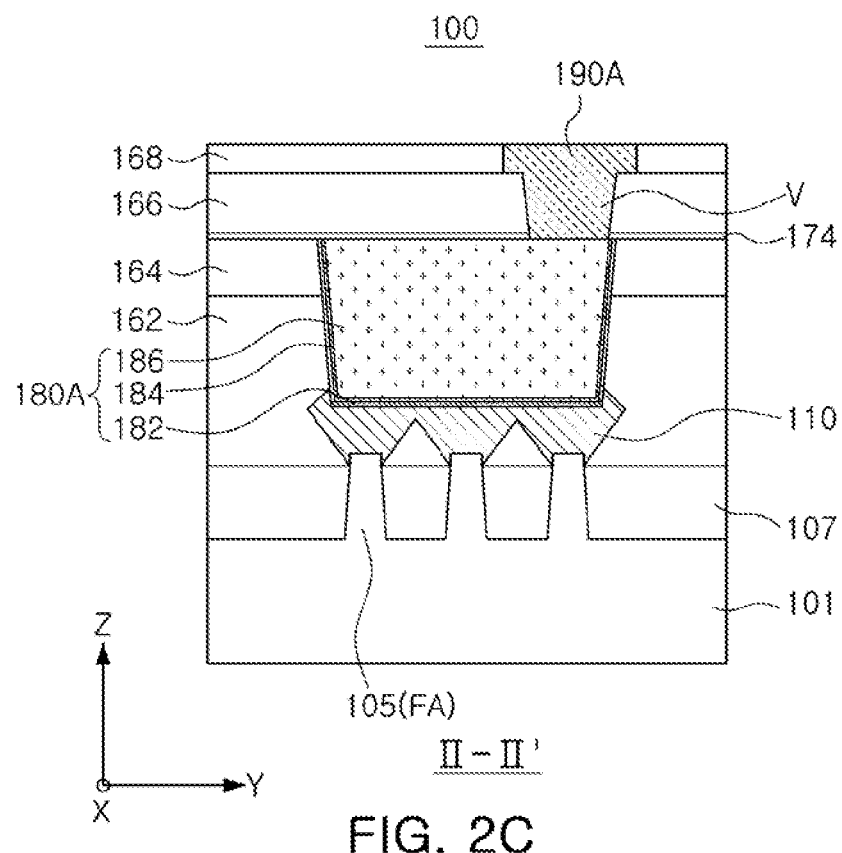
FIG. 2C is a cross-sectional view taken along line II-II' of FIG. 1.

FIG. 1 is a layout of a semiconductor device according to an example embodiment of the present disclosure. FIGS. 2A and 2B are cross-sectional views taken along lines I1-I1' and I2-I2' of FIG. 1, respectively. FIG. 2C is a cross-sectional view taken along line II-II' of FIG. 1.

Referring to FIGS. 1 and 2C, a semiconductor device 100 may include a substrate 101 having three fin-type active regions FAs. The three fin-type active regions FAs may extend in a first direction, for example, an X direction, and may be arranged and spaced apart in a second direction, for example, a Y direction.

The substrate 101 may have an upper surface extending in the X and Y directions. The substrate 101 may include a semiconductor such as, for example, silicon (Si) or germanium (Ge), or a compound semiconductor such as, for example, silicon germanium (SiGe), silicon carbide (SIC), gallium arsenide (GaAs), indium arsenide (InAs), aluminum gallium arsenide (AlGaAs), indium gallium arsenide (InGaAs) or indium phosphide (InP). In an example embodiment of the present disclosure, the substrate 101 may have a silicon on insulator (SOI) structure. The substrate 101 may include a conductive region, for example, a well doped with an impurity or a substrate, doped with an impurity.

Side walls of a lower portion of the three fin-type active regions FAs disposed on the substrate 101 may be covered by a device separator 107, and the three fin-type active regions FAs may protrude upwardly through the device separator 107 in a direction, for example, in a Z direction, perpendicular to the upper surface (which is on an X-Y plane) of the substrate 101. A bottom level of each of the three fin-type active regions FAs may be indicated by dotted lines BL in FIGS. 2A and 2B. The device separator 107 may be formed to limit and/or define an active region, for example, the fin-type active region FA, of the substrate 101.

As illustrated in FIGS. 2A and 2B, source/drain regions 110 may have a raised source/drain (RSD) structure having an upper surface disposed on a level, higher than that of an upper surface of the fin-type active region FA. RSD structure may reduce resistance caused by thin fins. The source/drain regions 110 may include a semiconductor layer epitaxially grown from the fin-type active region FA. In an example embodiment of the present disclosure, the source/drain regions 110 may have an embedded SiGe structure including a plurality of selectively epitaxially grown SiGe layers. The plurality of SiGe layers may have different contents of Ge. The source/drain regions 110 may have a structure in which the three fin-type active regions FAs may be merged with one another in a growth process. That is, one source/drain region grown from one fin-type active region may be merged with one or more source/drain regions grown from adjacent fin-type active regions.

As illustrated in FIG. 2C, the source/drain regions 110 may have a pentagonal shape, but the present disclosure is not limited thereto, and the source/drain regions 110 may have various shapes. For example, the source/drain regions 110 may have one of polygonal, circular, and rectangular shapes.

As illustrated in FIG. 1, three gate structures 140 may extend in the Y direction over the upper surfaces of the three fin-type active regions FAs, and may be arranged and spaced apart in the X direction. As illustrated in FIGS. 2A and 2B, each of the three gate structures 140 may have a gate insulating layer 142 and a gate electrode 145. The gate insulating layer 142 and the gate electrode 145 may extend in the Y direction and may intersect the fin-type active region FA extending in the X direction, while covering the upper surface and both side walls of the fin-type active region FA and an upper surface of the device separator 107. A plurality of metal-oxide semiconductor (MOS) transistors may be formed in regions in which the fin-type active region FA and a plurality of gate structures 140 intersect. Each of the MOS transistors may have a three-dimensional structure in which channels are formed in portions of the fin-type active region at locations where the gate structures cover the upper surface and both side walls of the fin-type active region FA.

Both side walls of the gate structure 140 may be covered by insulating spacers 150. The insulating spacers 150 may include, for example, a silicon nitride, a silicon oxynitride, or a combination thereof.

The gate insulating layer 142 may include, for example, a silicon oxide layer, a high-k dielectric layer, or a combination thereof. The high-k dielectric layer may include a material having a dielectric constant greater than that of a silicon oxide layer, for example, having a dielectric constant of about 10 to about 25. For example, the high-k dielectric layer may include at least one of a hafnium oxide, a hafnium oxynitride, a hafnium silicon oxide, a lanthanum oxide, a lanthanum aluminum oxide, a zirconium oxide, a zirconium silicon oxide, a tantalum oxide, a titanium oxide, a barium strontium titanium oxide, a barium titanium oxide, a strontium titanium oxide, an yttrium oxide, an aluminum oxide, a lead scandium tantalum oxide, a lead zinc niobate, and combinations thereof, but the present disclosure is not limited thereto. The gate insulating layer 142 may be formed by, for example, an atomic layer deposition (ALD) process, a chemical vapor deposition (CVD) process, or a physical vapor deposition (PVD).

The gate electrode 145 may include a first gate electrode 145a and a second gate electrode 145b. The first gate electrode 145a may adjust a work function. The second gate electrode 145b may fill a space formed on the first gate electrode 145a. The first gate electrode 145a may serve as an antidiffusion layer for the second gate electrode 145b, but the present disclosure is not limited thereto.

The first and second gate electrodes 145a and 145b may include different materials. The first gate electrode 145a may include, for example, a metal nitride such as a titanium nitride (TIN), a tantalum nitride (TaN), or a tungsten nitride (WN). The second gate electrode 145b may include, for example, a metal material such as aluminum (Al), tungsten (W), or molybdenum (Mo), or a semiconductor material such as doped polycrystalline silicon.

An inter-gate insulating layer 162 may be formed between the gate structures 140. The inter-gate insulating layer 162 may cover the source/drain regions 110 among the three gate structures 140. The inter-gate insulating layer 162 may include, for example, a silicon oxide layer or a silicon nitride layer, but the present disclosure is not limited thereto.

A first interlayer insulating layer 164 and a second interlayer insulating layer 166 may be formed on the inter-gate insulating layer 162 and the gate structure 140. The first and second interlayer insulating layers 164 and 166 may include, for example, a tetra ethyl ortho silicate (TEOS) layer, an undoped silicate glass (USG) layer, a phosphosilicate glass (PSG) layer, a borosilicate glass (BSG) layer, a borophosphosilicate glass (BPSG) layer, a fluoride silicate glass (FSG) layer, a spin on glass (SOG) layer, a tonen silazene (TOSZ) layer, or any combination thereof. The first and second interlayer insulating layers 164 and 166 may be formed by, for example, a CVD process, a spin coating process, or the like. In an example embodiment of the present disclosure, the first interlayer insulating layer 164 may be a TOSZ layer, and the second interlayer insulating layer 166 may be a TEOS layer.

In an example embodiment of the present disclosure, the inter-gate insulating layer 162 and the first interlayer insulating layer 164 may have a blocking insulating layer formed therebetween. The blocking insulating layer may prevent a foreign substance such as oxygen from infiltrating into the gate electrode 145. In an example embodiment of the present disclosure, the inter-gate insulating layer 162 and the first interlayer insulating layer 164 may be implemented as a single interlayer insulating layer covering the source/drain region 110 and the gate structure 140.

As illustrated in FIGS. 2A and 2B, the source/drain regions 110 may be disposed within the fin-type active region FA at both sides of the gate structure 140. First contact plugs 180A may be connected to the source/drain regions 110, and may extend in a third direction, for example, in the Z direction, perpendicular to the upper surface of the substrate 101. That is, the first contact plugs 180A may extend in a substantially vertical direction from art upper surface of the substrate 101. A second contact plug 180B may be connected to the gate electrode 145 of the gate structure 140, and may extend in the Z direction. The second contact plug 180B may also extend in a substantially vertical direction from an upper surface of the substrate 101. The first and second contact, plugs 180A and 180B, employed in this example embodiment, may have different heights. For example, upper surfaces of the first contact plugs 180A and an upper surface of the second contact plug 180B may be disposed on different levels L1 and L2, respectively. The level L1 is lower than the level L2. In an example embodiment of the present, disclosure, the upper surfaces of the first contact plugs 180A and the upper surface of the second contact plug 180B may be disposed on the levels L2 and L1, respectively.

Referring to FIGS. 2A and 2B, the first contact plugs 180A may be connected to the source/drain regions 110 through the inter-gate insulating layer 162 and the first interlayer insulating layer 164. The first contact plugs 180A may be surrounded by the first interlayer insulating layer 164 to be insulated from other conductive elements. The first contact plugs 180A may have spacers 172 formed along side walls thereof. The spacers 172 may include, for example, a silicon nitride or a silicon oxide.

The source/drain regions 110 may have upper surfaces in which recesses 110R may be formed. The recesses 110R may have a sufficient depth D so that portions of the first contact plugs 180A may be disposed therein. As illustrated in FIG. 2C, the recesses 110R may have a relatively flat lower surface, but the present disclosure is not limited thereto. For example, the recesses HOP may be bent in the Y direction. The first contact plugs 180A may include conductive materials 186, extending from the insides of the recesses HOP in the third direction, for example, in the Z direction, perpendicular to the upper surface (which is on the X-Y plane) of the substrate 101. The conductive materials 186 may include, for example, tungsten (W), cobalt (Co), an alloy thereof, or a combination thereof.

The first contact plugs 180A may include metal silicide layers 182 to reduce contact resistance with the source/drain regions 110 which are the doping regions. For example, the metal silicide layers 182 may react with a semiconductor material, such as silicon (Si), SiGe, or germanium (Ge), of the source/drain regions 110 to be formed on the upper surfaces of the source/drain regions 110. In an example embodiment of the present disclosure, the metal silicide layers 182 may have a composition represented by $MSi_xD_y$. Here, M is a metal, D is an element having a component different from M and silicon (Si), x is greater than 0 and equal to or less than 3, and y is equal to or greater than 0 and equal to or less than 1. M may include, for example, titanium (Ti), cobalt (Co), nickel (Ni), tantalum (Ta), platinum (Pt), or a combination thereof, and D may include, for example, germanium (Ge), carbon (C), argon (Ar), krypton (Kr), xenon (Xe), or a combination thereof.

The first contact plugs 180A may include conductive barrier layers 184 disposed on lateral surfaces and lower surfaces thereof. The conductive barrier layers 184 may include a conductive metal nitride layer. For example, the conductive barrier layers 184 may include at least one of TiN, TaN, AlN, WN, and combinations thereof.

Based on an X-Y plane, cross sections of the first contact plugs 180A employed in this example embodiment may have a bar shape extending in the Y direction, as illustrated in FIGS. 1 and 2C. However, the shape of the cross sections of the first contact plugs 180A is not limited thereto, and the cross sections of the first contact plugs 180A may have, for example, a circular, oval, or polygonal shape.

Referring to FIG. 2A, the second contact plug 180B may be connected to the gate electrode 145 through the first and second interlayer insulating layers 164 and 166. Similar to the first contact plugs 180A, the second contact plug 180B may also have a spacer 172 formed along side walls thereof. The second contact plug 180B may include a conductive material 186 extending in the Z direction, and a conductive barrier layer 184 disposed on lateral surfaces and a lower surface of the conductive material 186. As illustrated in FIGS. 1 and 2C, based on the X-Y plane, a cross section of the second contact plug 180B employed in this example embodiment may have a hole shape. However, the shape of the cross section of the second contact plug 180B is not limited thereto, and the cross section of the second contact plug 180B may have, for example, a circular, oval, or polygonal shape.

As illustrated in FIG. 2A, the upper surfaces of the first contact plugs 180A may be disposed on the level L1 which is lower than the level L2 of an upper surface of the second contact plug 180B. The first and second contact plugs 180A and 180B may be formed through creating contact holes or trenches from planes at different levels, and thus in this example embodiment, a distance d between the first and second contact plugs 180A and 180B may be narrower than that between two contact holes to which a photolithography process is applied on the same plane at the same level. For example, the distance d between the first and second contact plugs 180A and 180B may be about 20 nm or less, and further about 10 nm or less. The distance d is the shortest distance between the first and second contact plugs 180A and 180B, for example, in X direction as shown in FIG. 2A.

The second interlayer insulating layer 166 may have first metal lines 190A and a second metal line 190B disposed thereon. The first metal lines 190A may have metal vias V disposed within the second interlayer insulating layer 166, and may be connected to the first contact plugs 180A through the metal vias V. Conversely, the second metal line 190B may be directly connected to the second contact plug 180B without a metal via. In detail, the upper surface of the second contact plug 180B may be exposed together with an upper surface of the second interlayer insulating layer 166, and thus the second metal line 190B may be directly connected to the second contact plug 180B on the second interlayer insulating layer 166.

As described above, the second contact plug 180B may be disposed up to the same level L2 as that of the second metal line 190B is disposed on, unlike the case of the first contact plugs 180A, which is disposed up to the level L1, and may thus be directly connected to the second metal line 190B without a via structure. Thus, the present disclosure may reduce the number of metal vias while maintaining a layout design of related art. As a result, the likelihood of contact defects due to a metal via may be reduced. An example of contact defects caused by the metal via is via open.

In the related art, the upper surfaces of the first contact plugs may be coplanar with the upper surface of the second contact plug. Both the first metal lines and the second metal line may be connected to the first contact plugs and the second contact plug, respectively, through metal vias. As a result, in the related art, larger spacing is required between the first contact plugs and the second contact plug. In addition, in the related art, the first contact plugs and the second contact plug may not have different heights, because it may lead to different heights in metal vias connected to the first contact plugs and the second contact plug, and a structure with different heights in metal vias is difficult for back end of line (BEOL) integration. On the other hand, no change to the metal level process, for example, the first metal level (M1) process is needed for fabricating the semiconductor device described in this example embodiment of the present disclosure.

The first and second metal lines 190A and 190B employed in this example embodiment may be formed by a damascene process. The second interlayer insulating layer 166 may include a low-k dielectric layer 163 formed around the first and second metal lines 190A and 190B and used in the damascene process. The low-k dielectric layer 168 may include, for example, a silicon oxide layer, a silicon oxynitride layer, a silicon oxycarbide (SiOC) layer, a hydrogenated silicon oxycarbide (SiCOH) layer, or a combination thereof.

The first and second metal lines 190A and 190B may include, for example, copper (Cu) or a copper-containing alloy. The metal vias V may be integrated with the first metal lines 190A to become part of the first metal lines 190A, and may be formed of the same metal or alloy as the first metal line 190A.

In this example embodiment, the semiconductor device 100 may further include an etch stop layer 174 disposed between the first and second interlayer insulating layers 164 and 166. The etch stop layer 174 may function to retard etching of a hole for the metal via V when the hole for the metal via V is being formed, while preventing a metal, for example, copper (Cu), which forms the first and second metal lines 190A and 190b and the metal via V, from diffusing into a lower region of the first end second metal lines 190A and 190B and the metal via V. However, the function of the etch stop layer 174 is not limited thereto, and the etch stop layer 174 may include an aluminum nitride (AlN).

FIGS. 3, 4, 5, 6, 7, 8, 9, 10A, 11A, 12A, 13A, 14A, and 15A are perspective views illustrating a method of manufacturing a semiconductor device according to an example embodiment of the present disclosure. FIGS. 10B, 10C, 11B, 11C, 12B, 13B, 14B, and 15B are cross-sectional views illustrating a method of manufacturing a semiconductor device according to an example embodiment of the present disclosure. This process of manufacturing a semiconductor device may foe understood as being performed for a portion of the semiconductor device corresponding to "SU" in the layout illustrated in FIG. 1.

Figure 3:
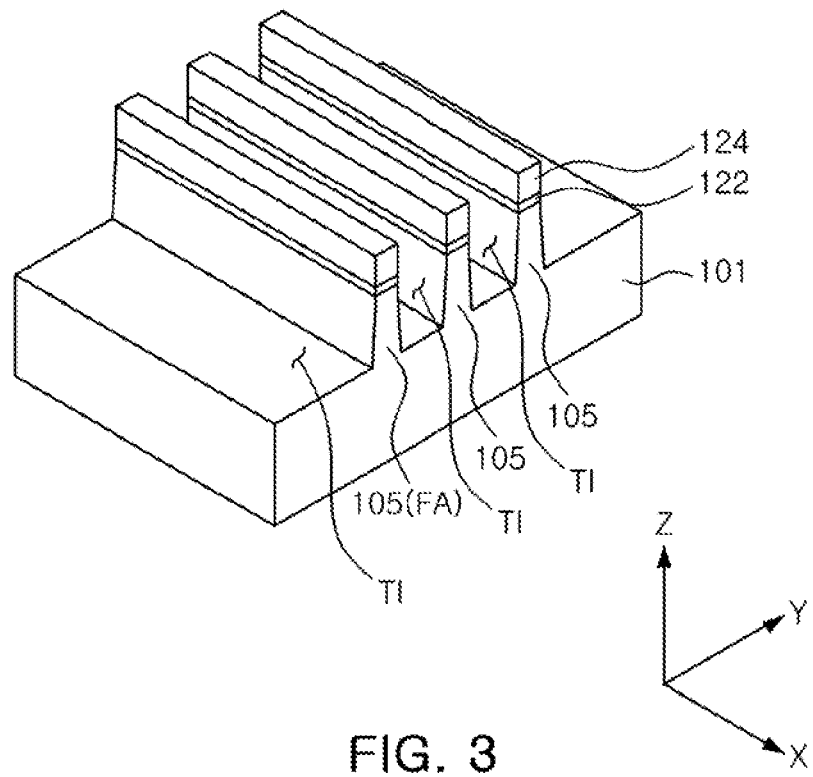
FIGS. 3, 4, 5, 6, 7, 8, 9, 10A, 11A, 12A, 13A, 14A, and 15A are perspective views illustrating a method of manufacturing a semiconductor device according to an example embodiment of the present disclosure.

Referring to FIG. 3, trenches TI, defining active fins 105, may be formed by patterning a substrate 101.

A pad oxide pattern 122 and a mask pattern 124 may be formed on the substrate 101 first. The pad oxide pattern 122 may be a layer to protect upper surfaces of the active fins 105 (also referred to as a "fin-type active region FA" in this specification). In an example embodiment of the present disclosure, the pad oxide pattern 122 may be removed. The mask pattern 124 may be a mask layer for patterning the substrate 101, and may include, for example, a silicon nitride, a carbon-containing material, or the like. The mask pattern 124 may have a multilayer structure.

The trenches TI may be formed by anisotropically etching the substrate 101, using the pad oxide pattern 122 and the mask pattern 124 as an etching mask. The trenches TI may have a high aspect ratio, and thus the width thereof may be narrower downwardly. Accordingly, the width of the active fins 105 may foe narrower upwardly.

In an example embodiment of the present disclosure, the substrate 101 may have a P-channel metal-oxide-semiconductor field-effect transistor (P-MOSFET) region or an N-channel metal-oxide-semiconductor field-effect transistor (N-MOSFET) region, and the active fins 105 may include P-type or N-type impurity diffusion regions according to a desired channel type of a metal-oxide-semiconductor field-effect transistor (MOSFET).

Figure 4:
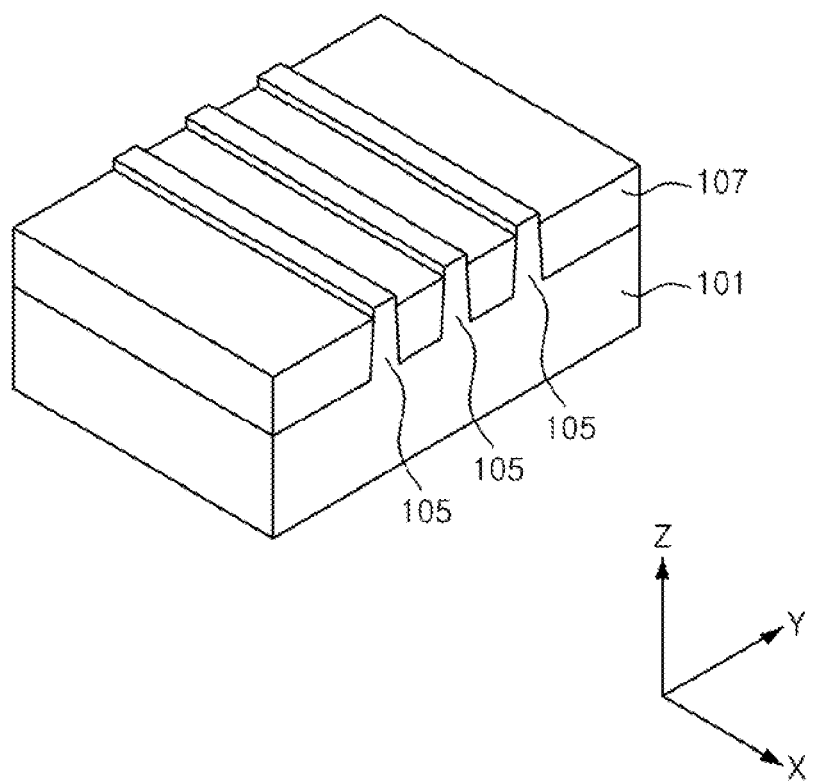

Referring to FIG. 4, a device separator 107 filling the trenches TI may be formed.

First, a process of filling the trenches TI with an insulating material and then planarizing the filled trenches TI may be performed. During the process, at least portions of the pad oxide pattern 122 and the mask pattern 124 may be removed, in an example embodiment of the present disclosure, a liner layer having a relatively reduced thickness may be formed within the trenches TI, and then the trenches TI may be filled with the insulating material.

Subsequently, a process of allowing the active fins 105 to protrude from the substrate 101 by etching back the insulating material filling the trenches TI may be performed.

This process may be performed with, for example, a wet etching process using at least a portion of the pad oxide pattern 122 as an etching mask. Accordingly, the active fins 105 may protrude upwardly by a predetermined height, and the predetermined height may vary. During the wet etching process, the pad oxide pattern 122 may also be removed. The device separator 107 may include, for example, a silicon oxide layer, a silicon nitride layer, a silicon oxynitride layer, or a combination thereof.

Figure 5:
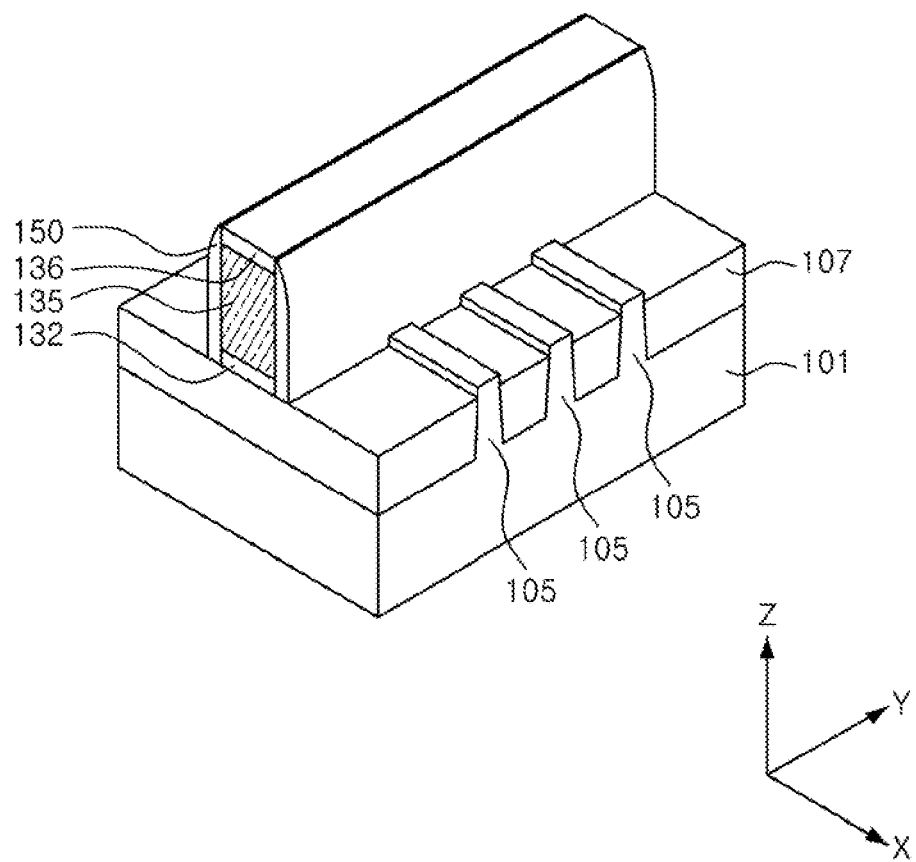

Referring to FIG. 5, a dummy gate insulating layer 132, a dummy gate electrode 135, and an insulating spacer 150 may be formed to extend in the Y direction while intersecting the active fins 105 which extend in the X direction.

The dummy gate insulating layer 132 and the dummy gate electrode 135 may form a desired dummy gate (DG) structure by performing an etching process using a mask pattern layer 136 as an etching mask. The dummy gate insulating layer 132 and the dummy gate electrode 135 may be formed in regions in which the gate insulating layer 142 and the first and second gate electrodes 145a and 145b (refer to FIG. 2A) are to be formed, and may be removed during a subsequent process. The dummy gate insulating layer 132 may include, for example, a silicon oxide, and the dummy gate electrode 135 may include, for example, polycrystalline silicon.

The insulating spacer 150 may be formed by forming a conformal layer having a uniform thickness on portions of the dummy gate insulating layer 132, the dummy gate electrode 135, and the mask pattern layer 136, and then anisotropically etching the formed layer. The insulating spacer 150 may also have a structure in which a plurality of layers are stacked.

Figure 6:
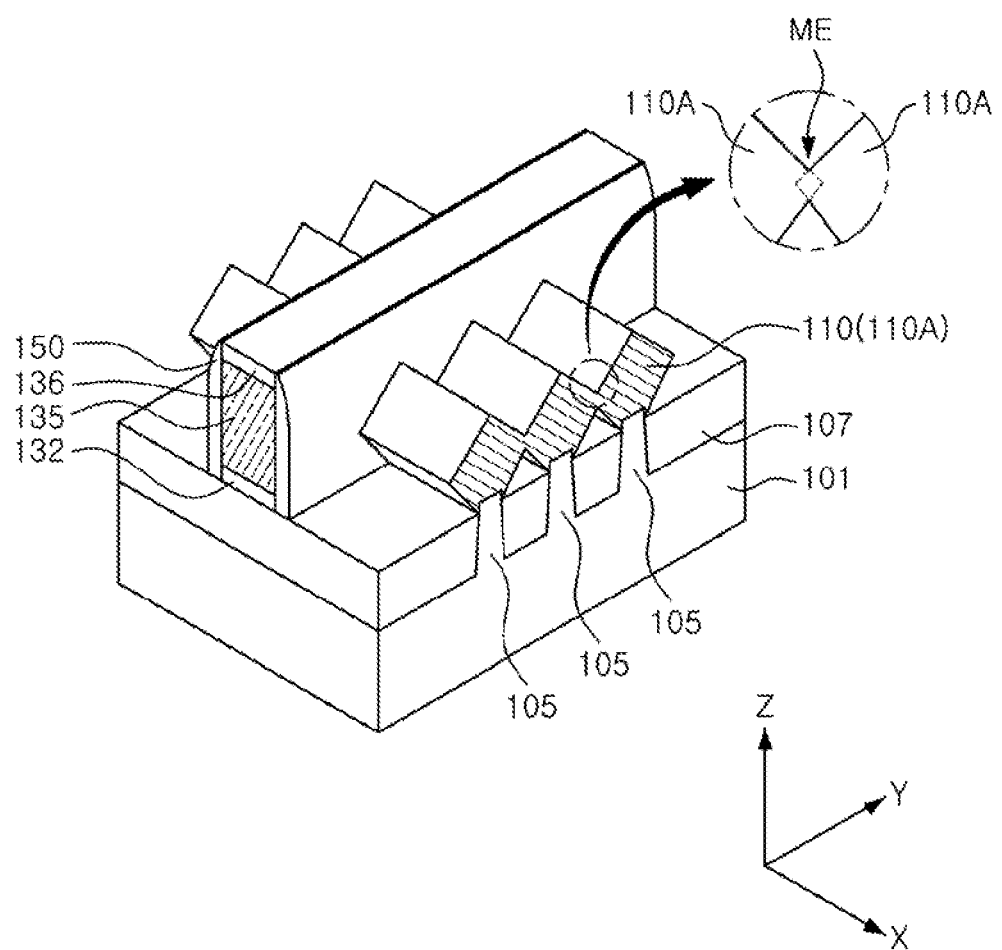

Referring to FIG. 6, source/drain regions 110, including crystalline semiconductor regions 110A, may be formed on portions of the active fins 105 exposed at both sides of the dummy gate (DG) structure.

The crystalline semiconductor regions 110A may be formed by a selective epitaxial growth (SEG) process. The crystalline semiconductor regions 110A formed on the active fins 105 may be connected to each other in the SEG process to form connecting portions ME. The crystalline semiconductor regions 110A grown on the respective portions of the active fins 105 may include germanium (Ge) having the same or different concentrations. The crystalline semiconductor regions 110A may be grown along a crystallographically stable surface in the SEG process to have a pentagonal or hexagonal shape, as illustrated in FIG. 6. The shape of cross sections of the source/drain regions 110 cut along a Y-Z plane thereof is not limited thereto, and may have, for example, a polygonal shape such as a quadrangular shape, a circular shape, or an oval shape.

The source/drain regions 110 may have upper surfaces disposed on a level higher than that of upper surfaces of the active fins 105 to form a raised source/drain (RSD) structure. The source/drain regions 110 may include a semiconductor layer doped with an impurity. In an example embodiment of the present disclosure, the source/drain regions 110 may include, for example, silicon (Si), SiGe, or SiC doped with an impurity.

Figure 7:
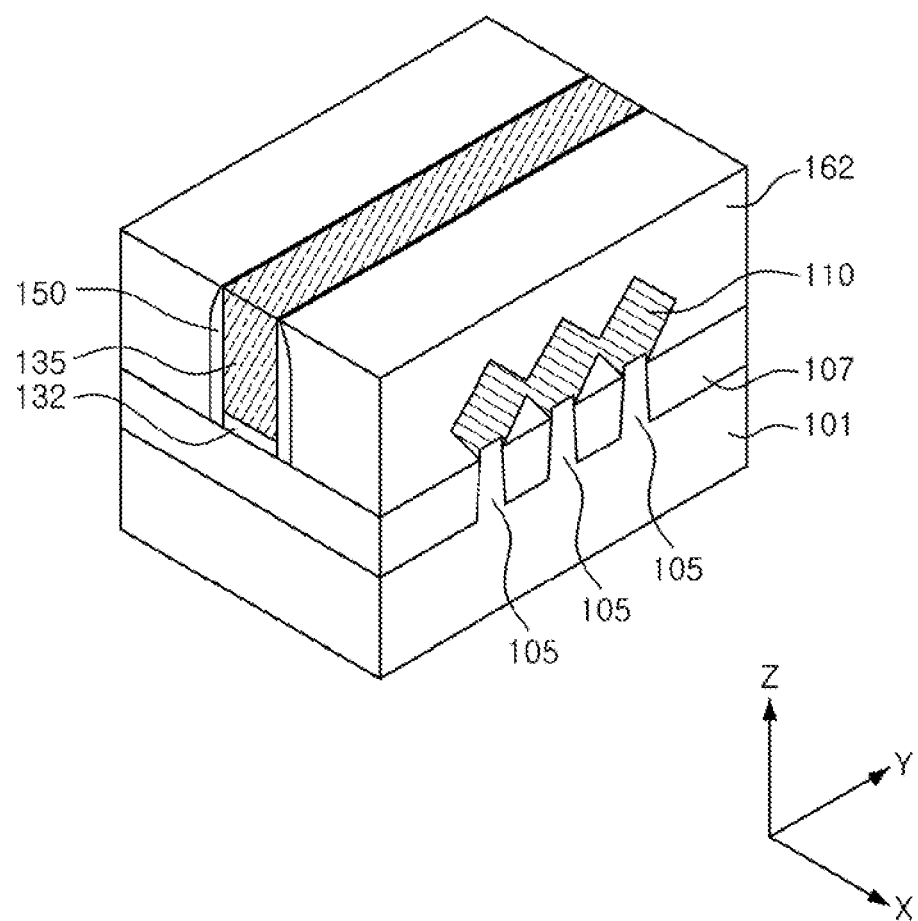

Referring to FIG. 7, an inter-gate insulating layer 162 may be formed on the source/drain regions 110.

In an example embodiment of the present disclosure, in the process of forming the inter-gate insulating layer 162, an insulating layer may be formed to have a sufficient thickness to cover the source/drain regions 110, the dummy gate (DG) structure, and the insulating spacer 150. Thereafter, a product in which the insulating layer is formed may be planarized to allow the dummy gate (DG) structure to be exposed. In this planarizing process, the mask pattern layer 136 may be removed, and an upper surface of the dummy gate electrode 135 may be exposed. The inter-gate insulating layer 162 may include, for example, at least one of an oxide, a nitride, and an oxynitride.

Figure 8:
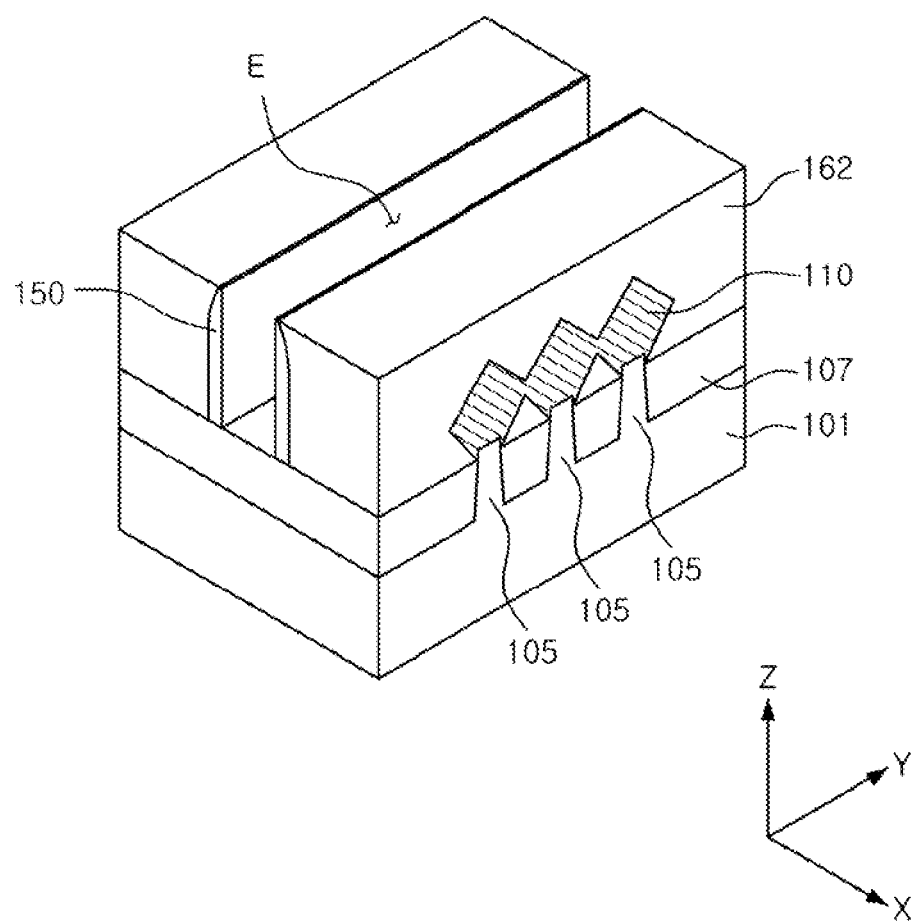

Referring to FIG. 8, a gate structure formation region E (also referred to as an "opening portion E") may be provided by removing the dummy gate insulating layer 132 and the dummy gate electrode 135.

The dummy gate insulating layer 132 and the dummy gate electrode 135 may be selectively removed from the device separator 107 and the active fins 103 disposed therebelow, and thus the opening portion E, exposing portions of the device separator 107 and the active fins 105, may be formed. A process of removing the dummy gate insulating layer 132 and the dummy gate electrode 135 may be performed using at least one of a dry etching process and a wet etching process.

Figure 9:
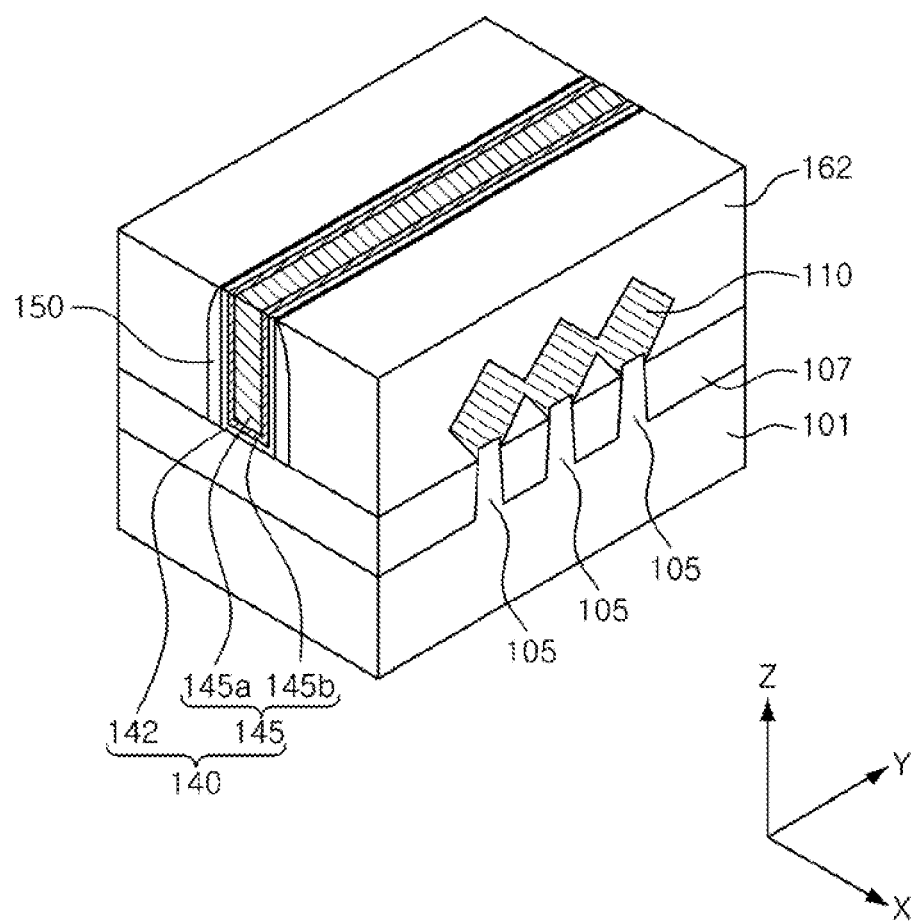

Referring to FIG. 9, a gate structure 140 may be formed by forming a gate insulating layer 142 and first and second gate electrodes 145a and 145b within the opening portion E.

The gate insulating layer 142 may be substantially conformally formed along side walls and a lower surface of the opening portion E. The gate insulating layer 142 may include, for example, an oxide, a nitride, or the above-mentioned high-k dielectric layer. The first and second gate electrodes 145a and 145b may include the above-mentioned metal or semiconductor material.

Figure 10A:
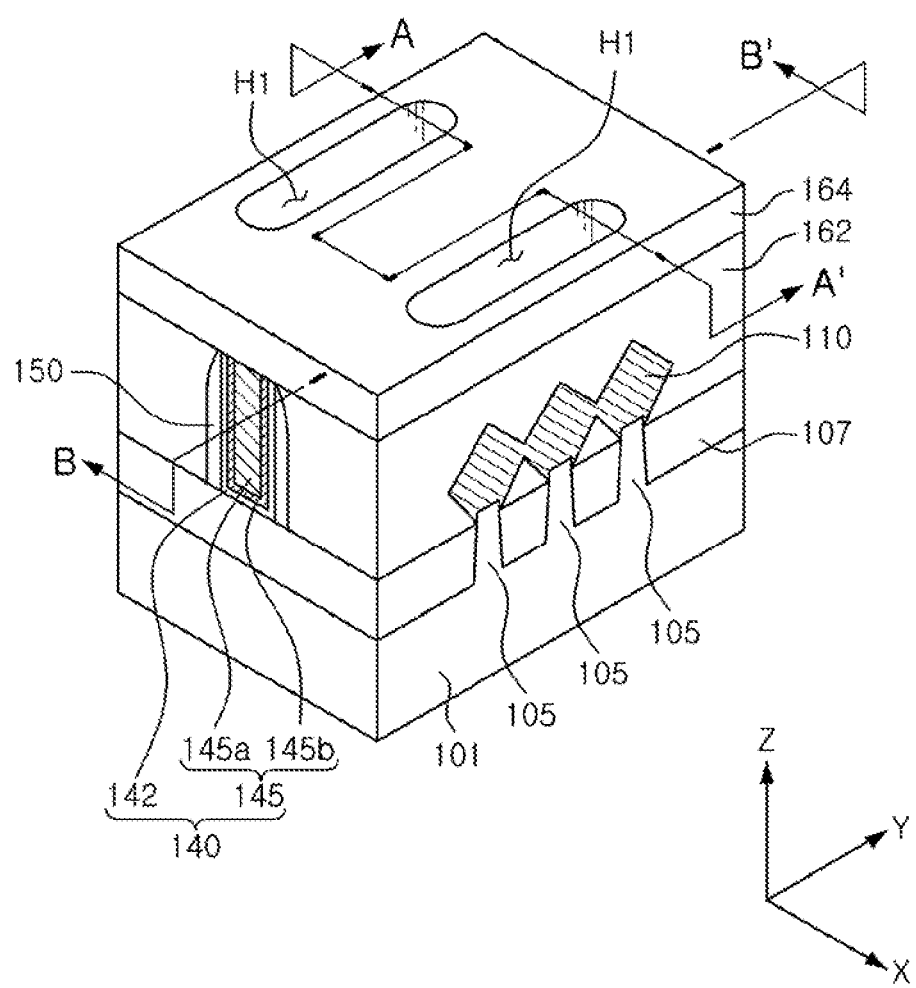
Figure 10B:
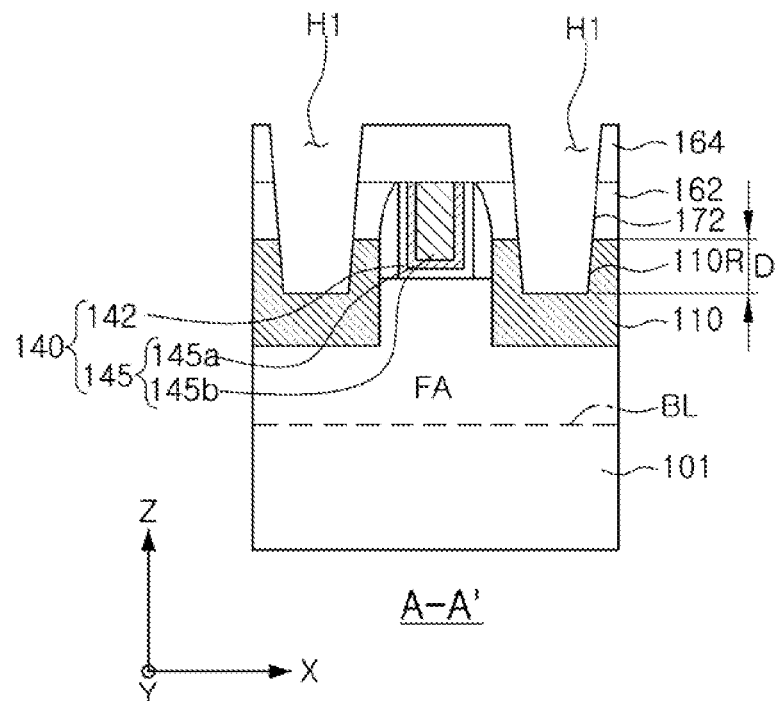
FIGS. 10B, 10C, 11B, 11C, 12B, 13B, 14B, and 15B are cross-sectional views illustrating a method of manufacturing a semiconductor device according to an example embodiment of the present disclosure.
Figure 10C:
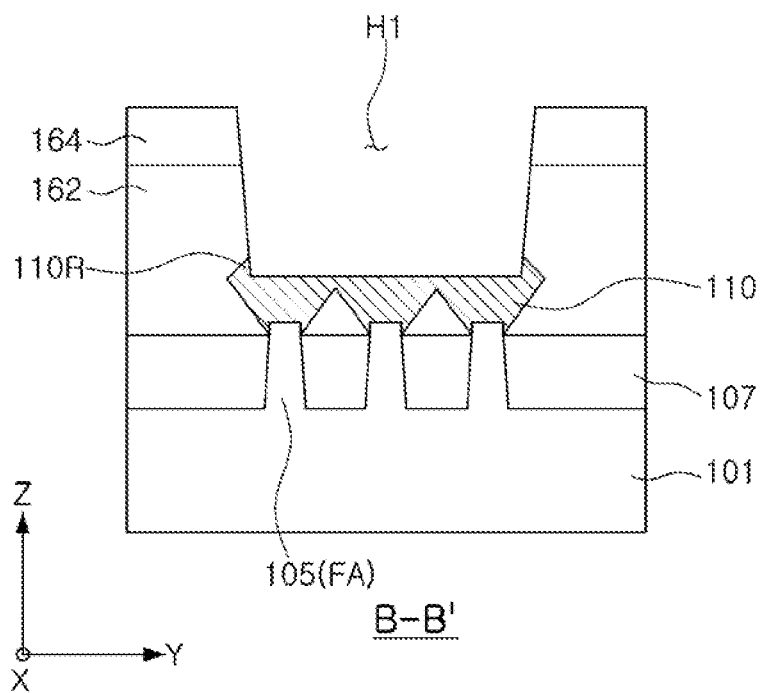

FIGS. 10A through 10C illustrate a subsequent process. FIGS. 10B and 10C illustrate cross sections taken along lines A-A' and B-B' of FIG. 10A, respectively. In this process, a first interlayer insulating layer 164 may be formed first, and then first contact holes H1 may be formed to connect the source/drain regions 110.

Each of the first contact holes H1 may define a region in which the first contact plug 180A (refer to FIG. 2A) is to be formed, and may be formed by removing portions of the inter-gate insulating layer 162 and the first interlayer insulating layer 164, using a separate etching mask layer such as a photoresist pattern during the etching process. In such a process of forming the first contact holes H1, portions of upper portions of the source/drain regions 110 may be removed along with the inter-gate insulating layer 162 and the first interlayer insulating layer 164 to form recesses 110R having a predetermined depth D (refer to FIGS. 10B and 10C). In this example embodiment, as illustrated in FIG. 10C, lower surfaces of the recesses 110R are illustrated as being substantially flat, but may be bent similarly to the upper surfaces of the source/drain regions 110. Such a bent profile may be obtained by setting different concentrations (a difference between etching rates) of at least one element, for example, germanium (Ge), included in the source/drain regions 110, to different regions.

Figure 11A:
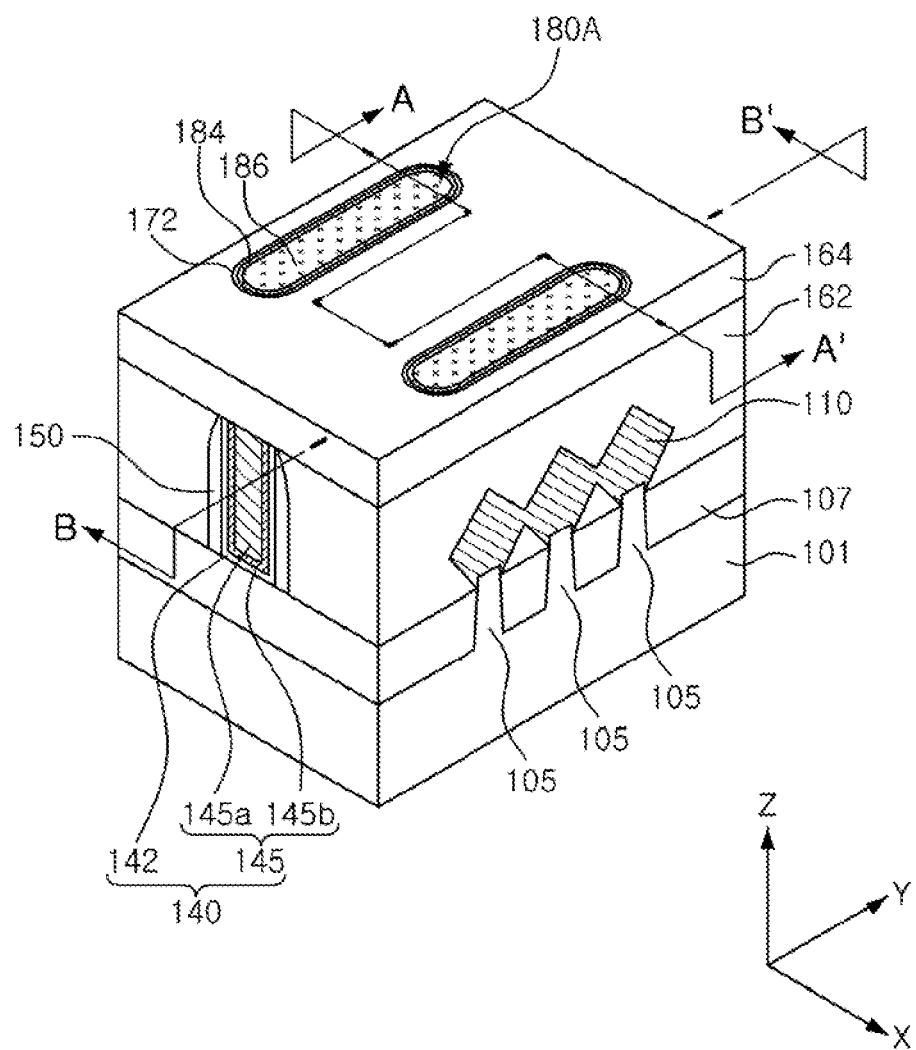
Figure 11B:
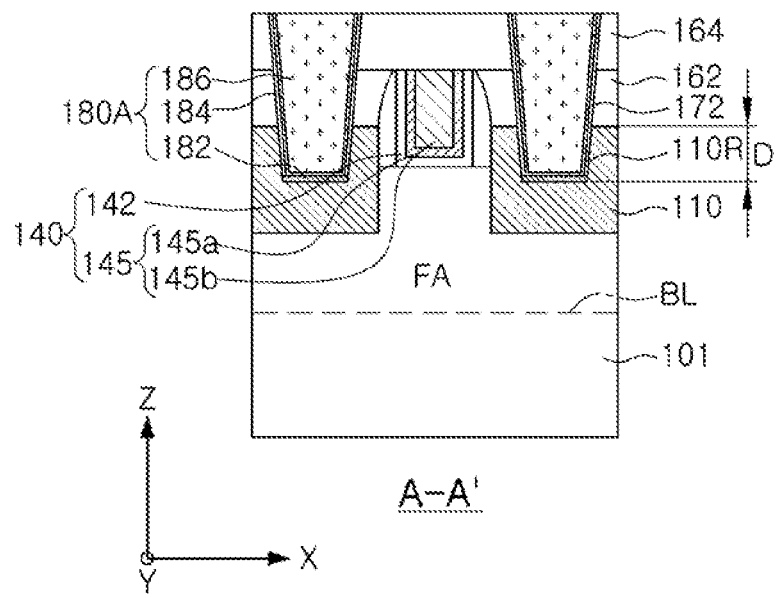
Figure 11C:
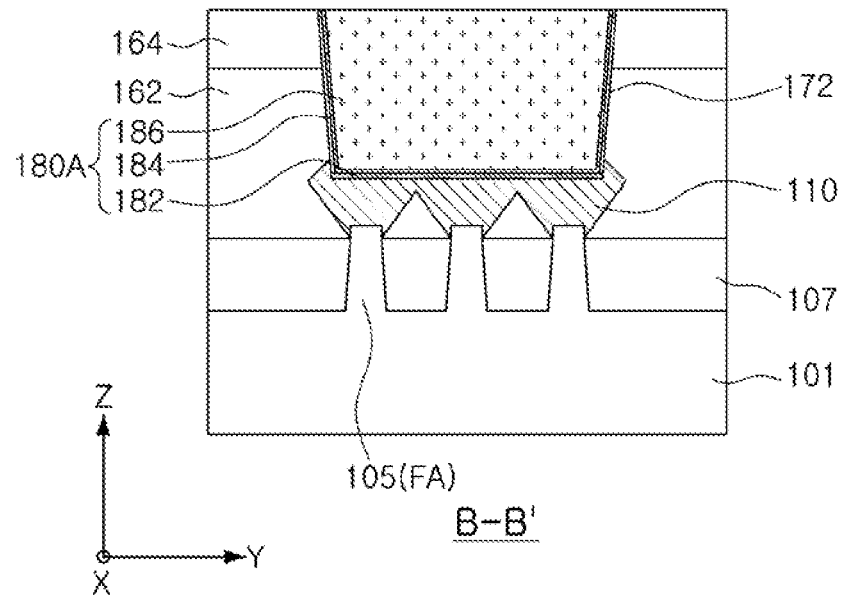

A subsequent process is illustrated in FIGS. 11A through 11C in a manner similar to those of FIGS. 10A through 10C. FIGS. 11B and 11C illustrate cross sections taken along lines A-A' and B-B' of FIG. 11A, respectively.

Referring to FIGS. 11A through 11C, first contact plugs 180A may be formed by filling the first contact holes H1 with a conductive material 186.

Prior to filling the conductive material 186, a process of forming metal silicide layers 182 and conductive barrier layers 184 may be performed. After metal layers are deposited on surfaces of the source/drain regions 110, the metal silicide layers 182 may be formed by allowing the metal layers to react with materials of the source/drain regions 110 in this process or a process subsequent thereto. The conductive barrier layers 184 may be deposited on upper surfaces of the metal silicide layers 182 and internal side walls of the first contact holes H1 prior to filling the conductive material 186. In this example embodiment, prior to forming the first contact plugs 180A, spacers 172 may be formed on the internal side walls of the first contact holes H1, using an insulating material such as, for example, a silicon oxide or a silicon nitride.

FIGS. 12A, 13A, 14A, and 15A are perspective views illustrating subsequent processes, and FIGS. 12B, 13B, 14B, and 15B are cross-sectional views taken along lines A-A' of FIGS. 12A, 13A, 14A, and 15A.

Figure 12A:
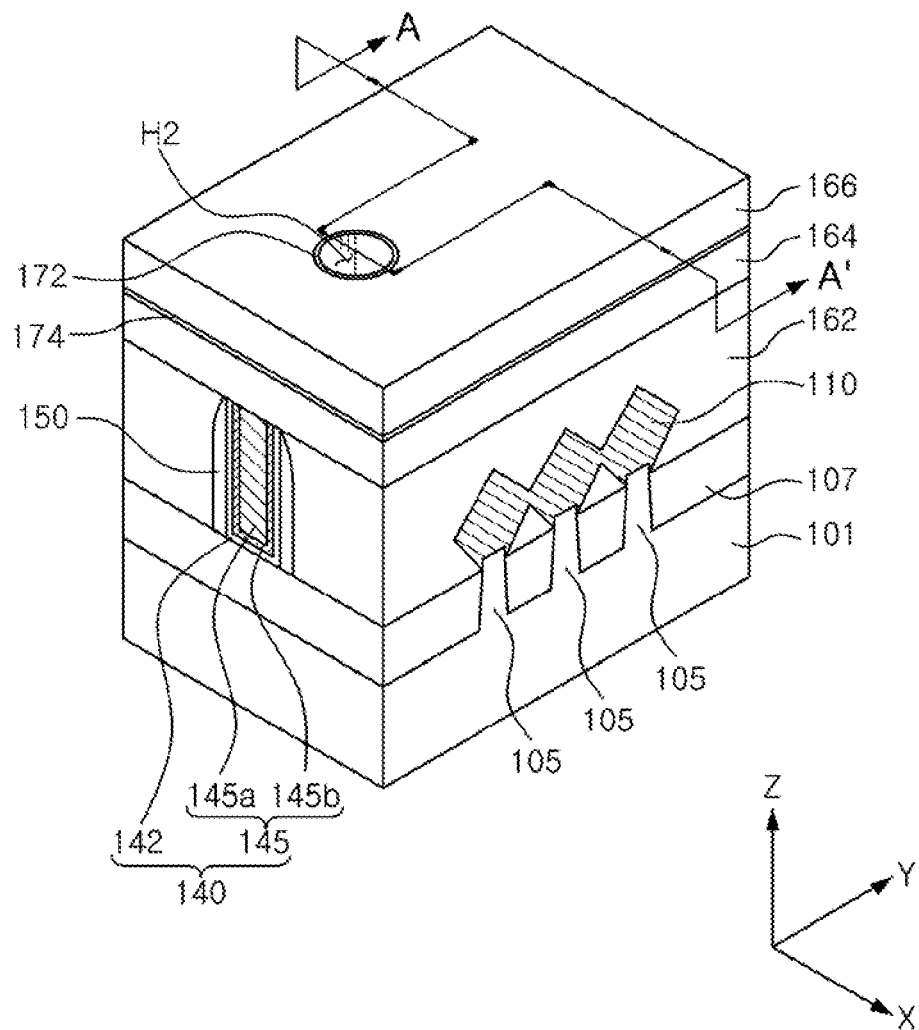
Figure 12B:
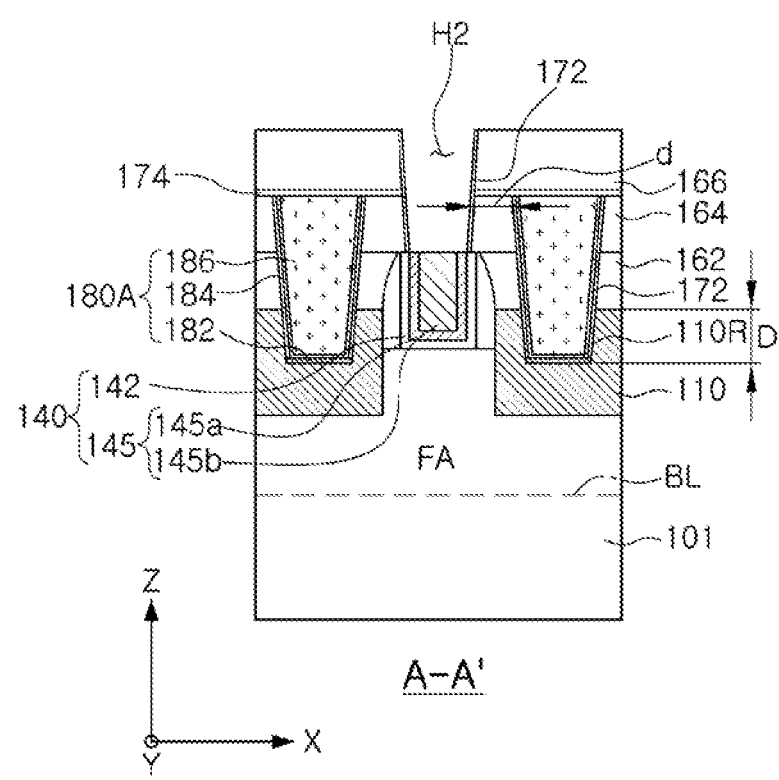

Referring to FIGS. 12A and 12B, a second interlayer insulating layer 166 may be formed on the first interlayer insulating layer 164, in which the first contact plugs 180A are formed, and a second contact hole H2 connected to the gate electrode 145 may be formed in the first and second interlayer insulating layers 164 and 166.

The second interlayer insulating layer 166 may include an insulating material, and may include, for example, at least one of an oxide layer, a nitride layer, and an oxynitride layer. Prior to forming the second interlayer insulating layer 166, an etch stop layer 174 may be formed on the first interlayer insulting layer 164. The etch stop layer 174 may function to prevent a metal, such as copper (Cu), from forming a metal line or the like by its diffusion to a lower portion of the etch stop layer 174 in which the fin-type active region FA is disposed. However, the function of the etch stop layer 174 is not limited thereto, and the etch stop layer 174 may include an aluminum nitride (AlN).

The second contact hole H2 formed in this process may define a region in which the second contact plug 180B (refer to FIG. 2A) is to be formed, and similar to the first contact holes H1, the second contact hole H2 may be formed by removing portions of the first and second interlayer insulating layers 164 and 166, using a separate etching mask layer such as a photresist pattern during the etching process. As described above, the second contact hole H2 may be formed with the upper surface in a plane at a level L2 which is different from a level L1 of the upper surfaces of the first contact holes H1, and thus a distance between the first contact holes H1 and the second contact hole H2 may be less than that between the first contact holes H1 and the second contact hole H2 formed with their upper surfaces in the same plane at the same level.

In this example embodiment, the first contact holes H1 for the first contact plugs 180A may have a bar shape extending in the Y direction, while the second contact hole H2 for a second contact plug 180B (refer to FIG. 13A) may have a simple hole shape. Such a design may be associated with the layout illustrated in FIG. 1. In an example embodiment of the present disclosure, the shapes of the first contact plugs 180A and the second contact plug 180B may be modified to have other shapes than those described above. In this process, spacers 172 may be formed of an insulating material such as, for example, a silicon oxide or a silicon nitride, on internal side walls of the second contact hole H2.

Figure 13A:
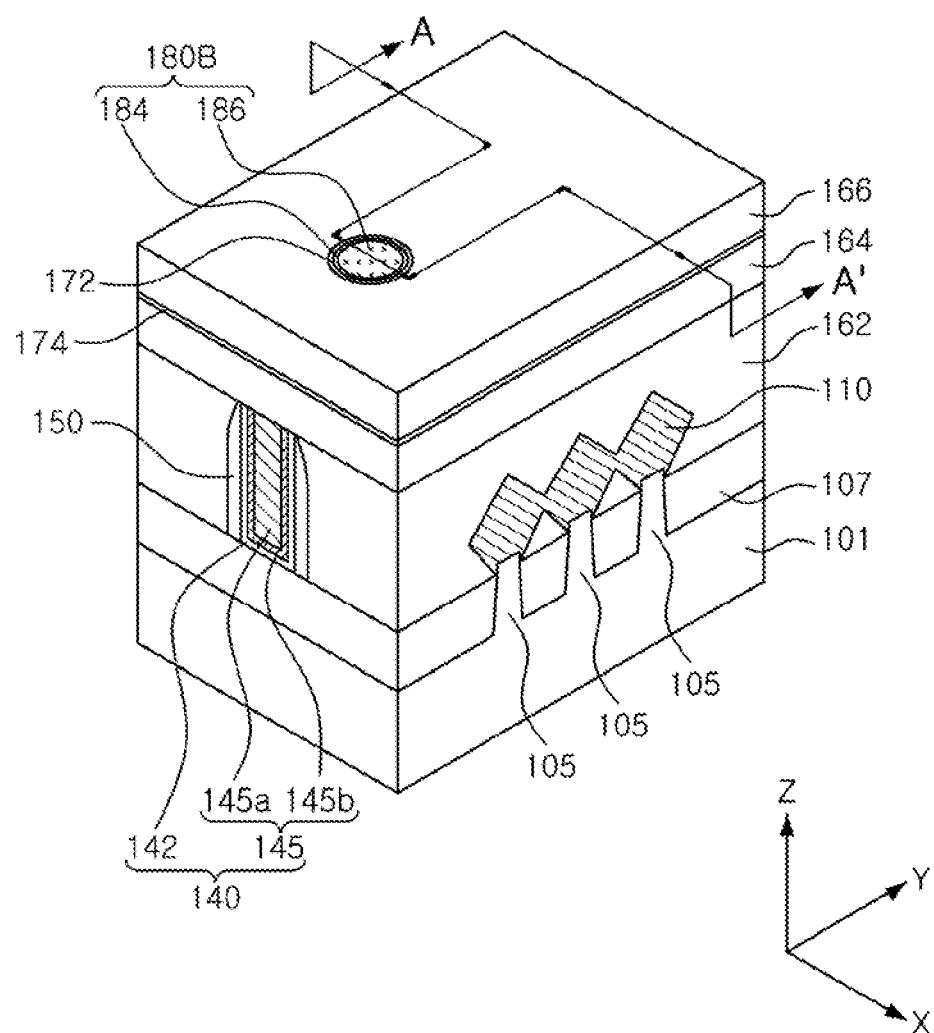
Figure 13B:
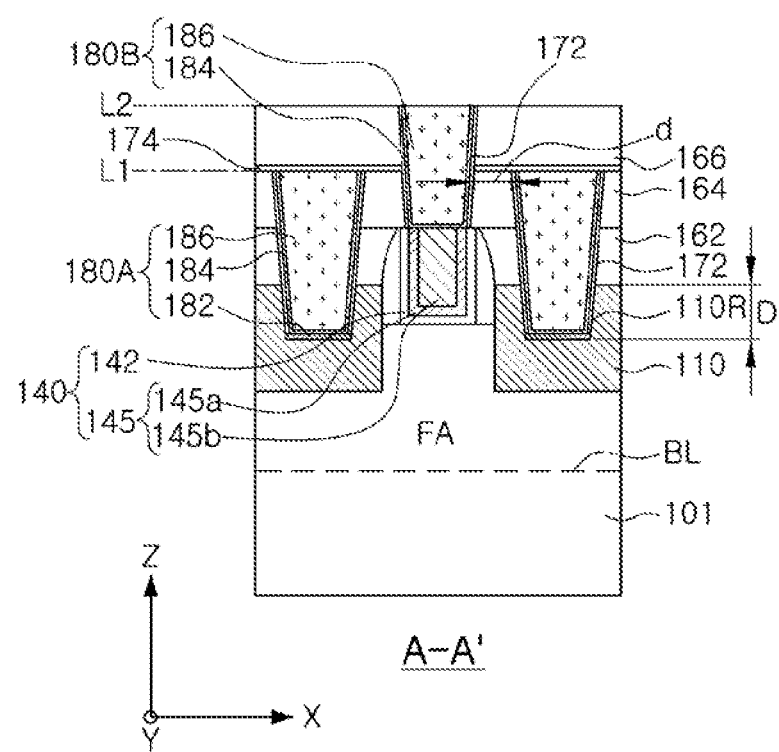

Referring to FIGS. 13A and 13B, the second contact plug 180B may be formed by filling the second contact hole H2 with a conductive material 186.

Similar to the process of forming the first contact plugs 180A, prior to filling the conductive material 186, a process of forming a conductive barrier layer 184 may be performed. The second contact plug 180B may be in direct contact with the gate electrode 145, which is an electrode body, and thus, as illustrated in this example embodiment, a metal silicide layer for reducing contact resistance may not be required.

Subsequently, first metal lines 190A and a second metal line 190B, connected to the first contact plugs 180A and the second contact plug 180B, respectively, may be formed on the second interlayer insulating layer 166. This process of forming the first metal lines 190A and the second metal line 190B may be performed using a damascene process.

Figure 14A:
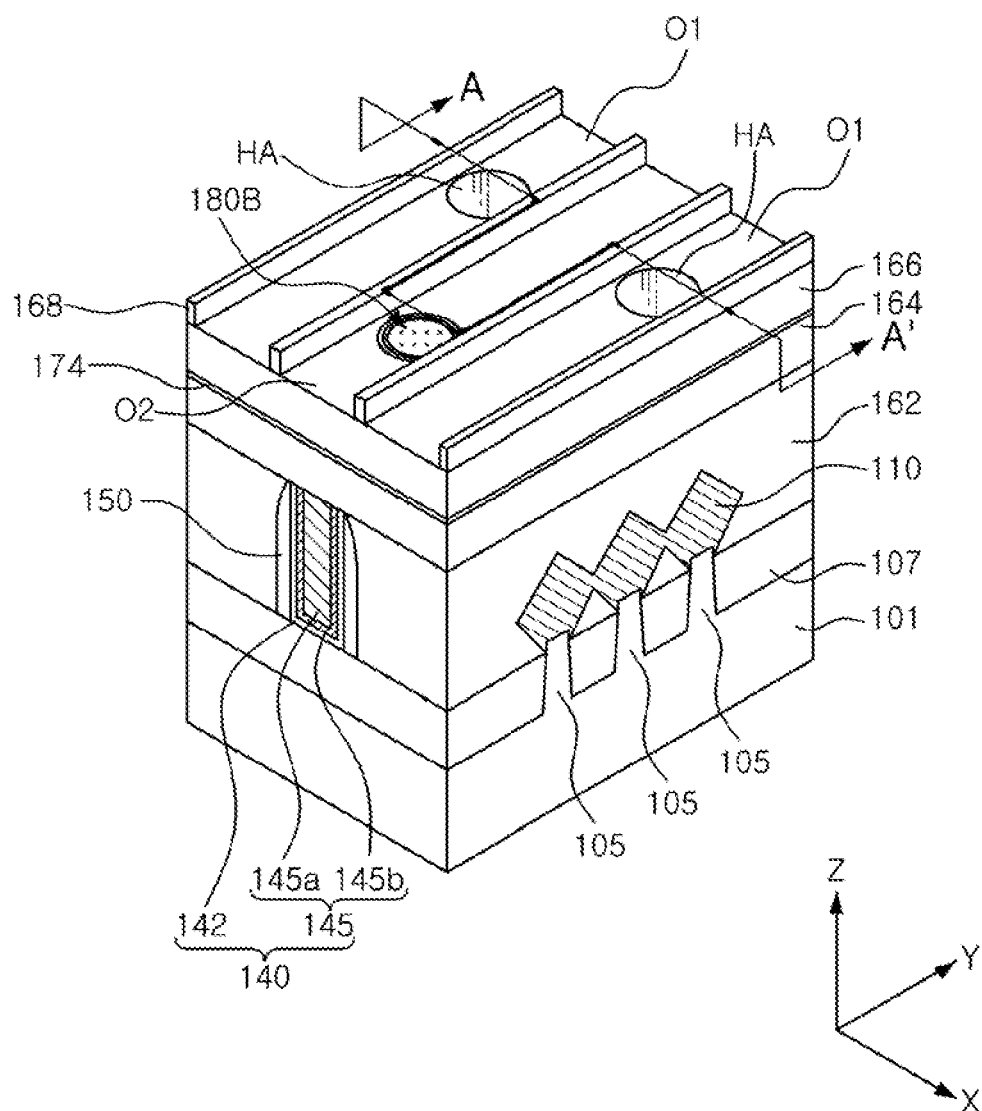
Figure 14B:
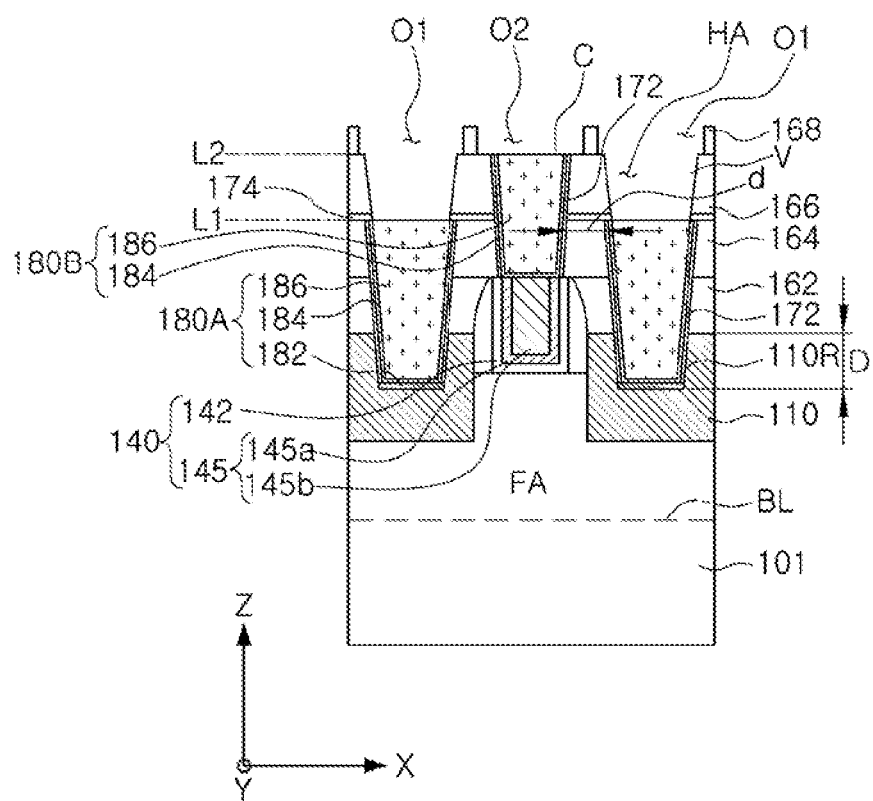

First, as illustrated in FIGS. 14A and 14B, a low-k dielectric layer 168, having first regions O1 and a second region O2 open, may be formed on the second interlayer insulating layer 166. The first and second regions O1 and O2 may define regions for the first and second metal lines 190A and 190B, respectively. In this example embodiment, the low-k dielectric layer 168 may be illustrated as being implemented as a linear shape, but if necessary, the shape of the first and second regions O1 and O2 may vary. The low-k dielectric layer 168 may include, for example, a silicon oxide layer, a silicon oxynitride layer, a silicon oxycarbide (SiOC) layer, a hydrogenated silicon oxycarbide (SiCOH) layer, or a combination thereof.

Holes HA, connected to the first contact plugs 180A, may be formed in portions of the second interlayer insulating layer 166 exposed by the first regions O1. Upper surface regions of the first interlayer insulating layer 164 may be exposed by the holes HA, and the upper surfaces of the first contact plugs 180A may be exposed with the exposed upper surface regions of the first interlayer insulating layer 164. The second contact plug 180B may be disposed up to the upper surface of the second interlayer insulating layer 166, differently from the first contact plugs 180A being disposed, and thus the upper surface of the second contact plug 180B may be exposed together with a portion of the second interlayer insulating layer 166 by the second region O2.

Figure 15A:
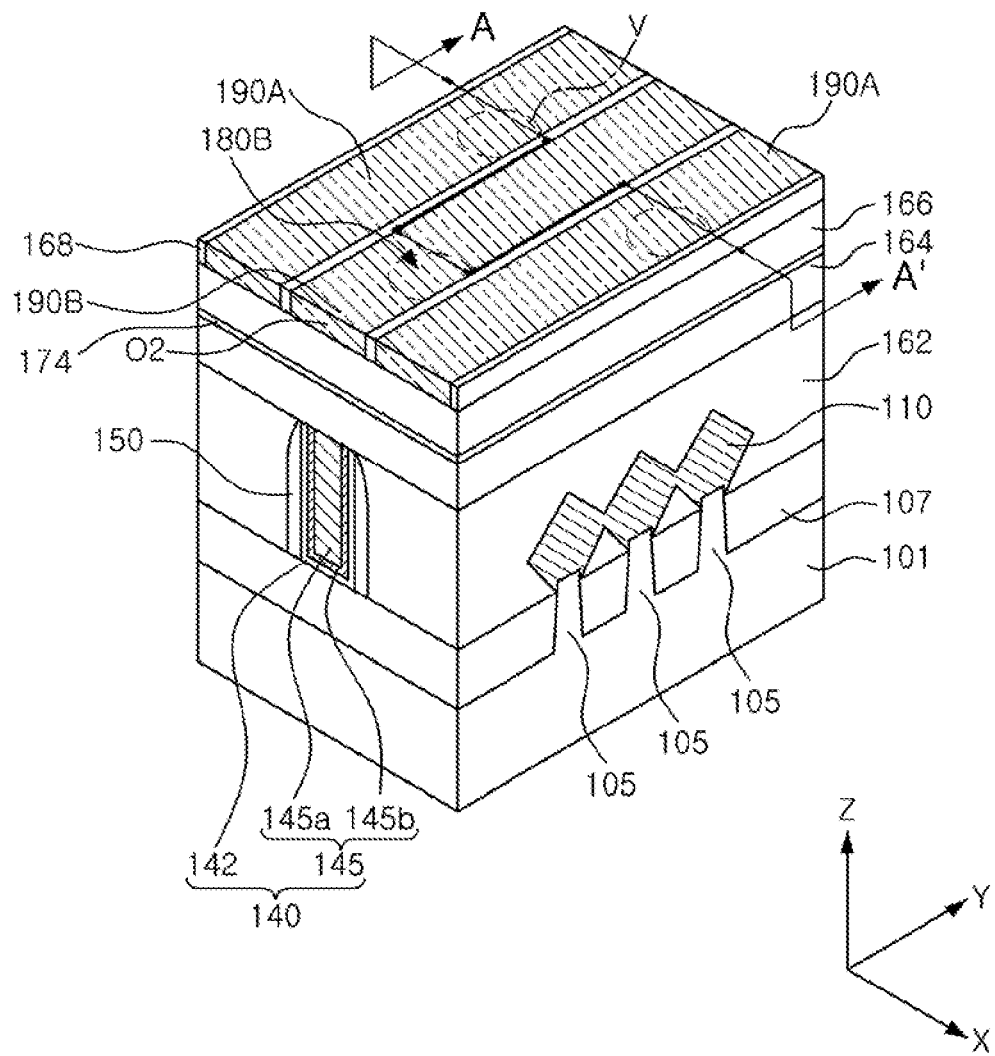
Figure 15B:
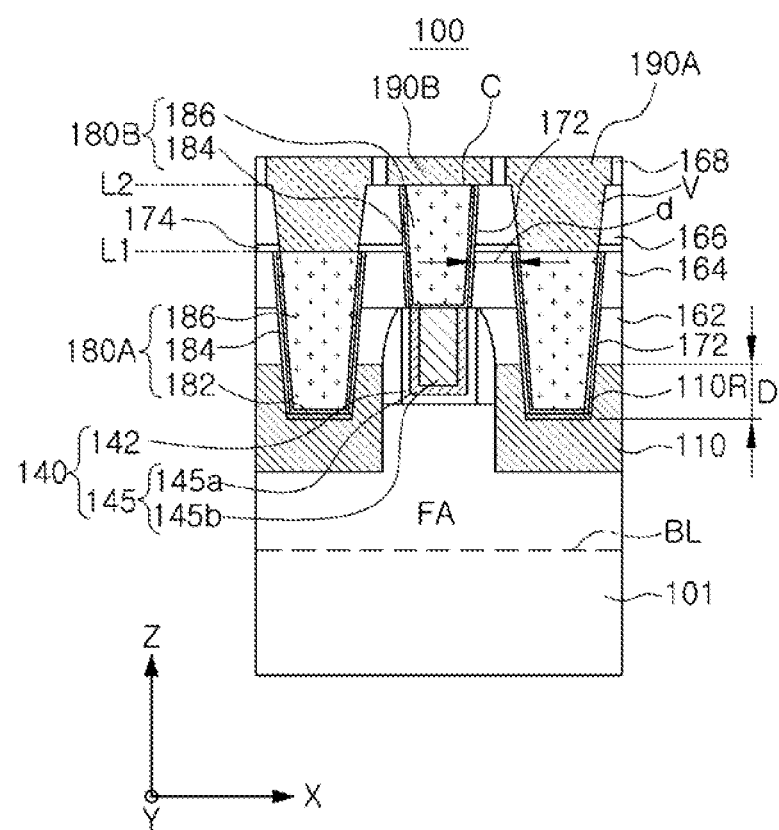

Subsequently, as illustrated in FIGS. 15A and 15B, the first and second metal lines 190A and 190B may be formed and connected to the first and second contact plugs 180A and 180B, respectively.

This process of forming the first and second metal lines 190A and 190B may be performed by forming metal layers to fill the holes HA and the first and second regions O1 and O2, and then planarizing the metal layers so as to expose an upper surface of the low-k dielectric layer 168. Such metal layers may include, for example, copper (Cu) or a copper-containing alloy.

The first and second metal lines 190A and 1903 may be formed on the second interlayer insulating layer 166. The first, metal lines 190A may be connected to the first contact plugs 180A by metal vias V, while the second metal line 190B may be directly connected to the second contact plug 180B. As described above, the second contact plug 180B may be disposed up to the same level L2 as that of the second metal line 1905 is disposed on and from, and may thus be directly connected to the second metal line 190B without a via structure. The metal vias V may be integrated with the first metal lines 190A to become part of the first metal lines 190A, and may be formed of the same metal or alloy as that of the first metal lines 190A.

Figure 16:
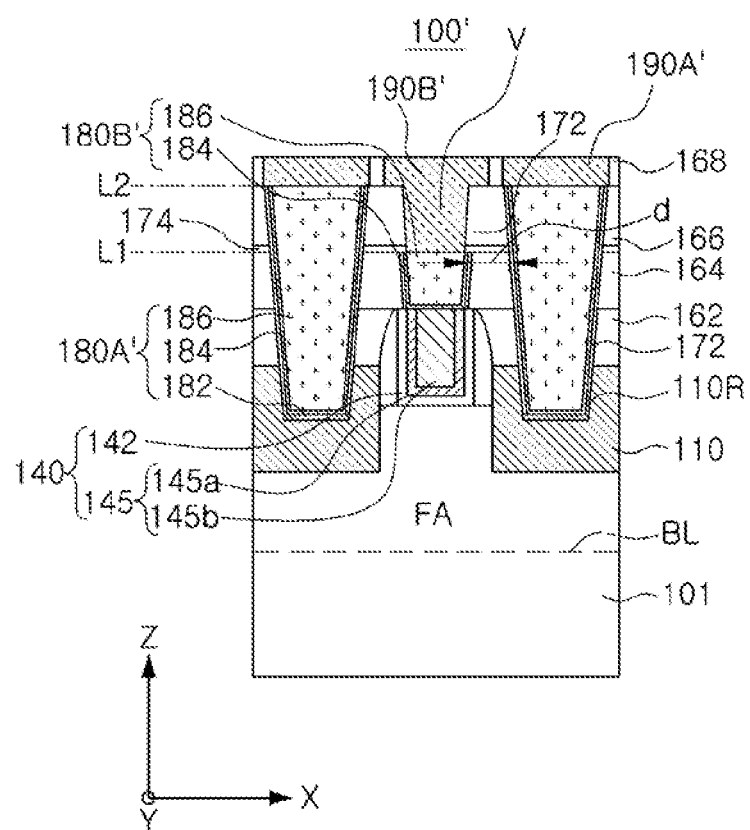
FIG. 16 is a cross-sectional view of a semiconductor device according to an example embodiment of the present disclosure.

FIG. 16 is a cross-sectional view of a semiconductor device according to an example embodiment of the present disclosure.

Referring to FIG. 16, a semiconductor device 100' according to an example embodiment of the present disclosure may include first contact plugs 180A', and a second contact plug 180B' disposed up to levels opposite the levels L1 and L2 of the first contact plugs 180A and the second contact plug 180B illustrated in the above example embodiment. That, is, the upper surfaces of the first contact plugs 180A' are at the level L2, and the upper surface of the second contact plug 180B' is at the level L1.

In the semiconductor device 100' described above, the first contact plugs 180A' may be formed through an inter-gate insulating layer 182, a first interlayer insulating layer 164, and a second interlayer insulating layer 166, and the second contact plug 180B' may be formed through the first interlayer insulating layer 164. Thus, upper surfaces of the first contact plugs 180A' may be disposed on a level L2 higher than a level L1 of an upper surface of the second contact plug 180B'.

In this example embodiment, the first and second metal lines 190A' and 190B' may be formed on the second interlayer insulating layer 166. The first metal lines 190A' may be directly connected to the first contact plugs 180A', while the second metal line 190B' may be connected to the second contact plug 180B' by a metal via V. The metal via V may be integrated with the second metal line 190B', and may be part of the second metal line 190B'. In this example embodiment, the first contact plugs 180A' and the first metal lines 190A' may be directly connected to each other without having metal vias V disposed therebetween, thereby reducing the likelihood of contact defects caused by metal vias. Via open is one of the contact defects caused by metal vias.

Figure 17:
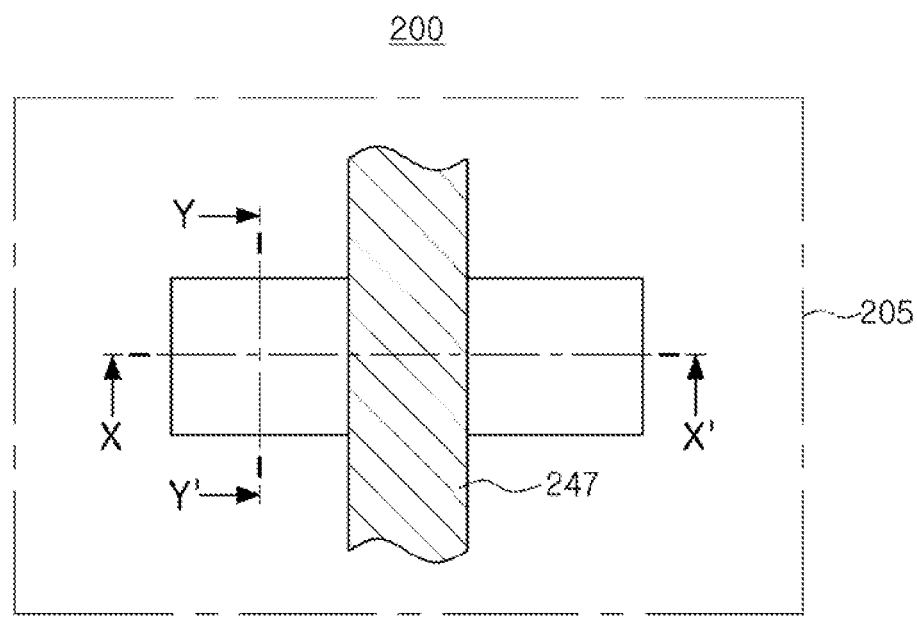
FIG. 17 is a layout of a semiconductor device according to an example embodiment of the present disclosure.
Figure 18:
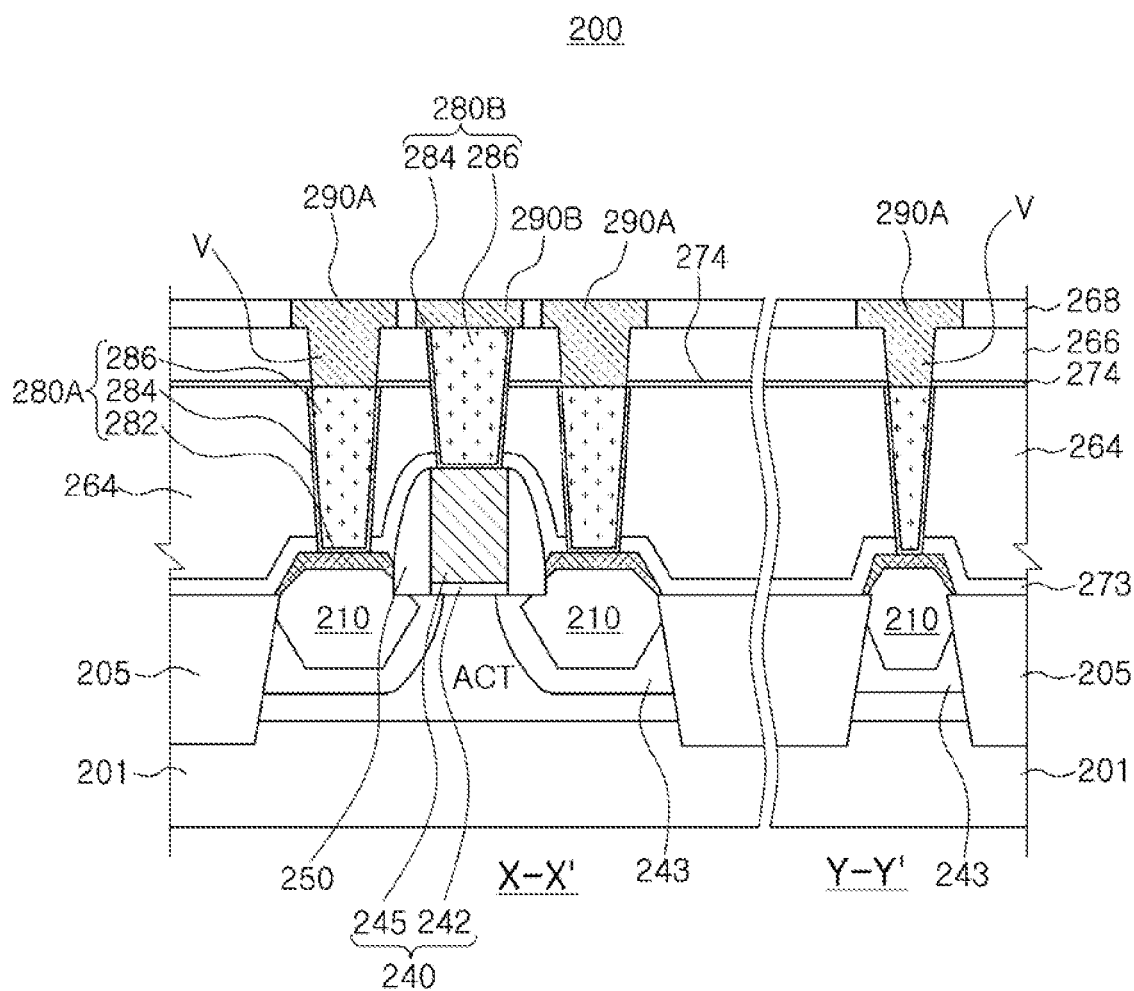
FIG. 18 is a cross-sectional view of a semiconductor device according to an example embodiment of the present disclosure.

FIG. 17 is a layout of a semiconductor device according to an example embodiment of the present disclosure. FIG. 18 is a cross-sectional view taken along lines X-X' and Y-Y' of FIG. 17.

Figure 19:
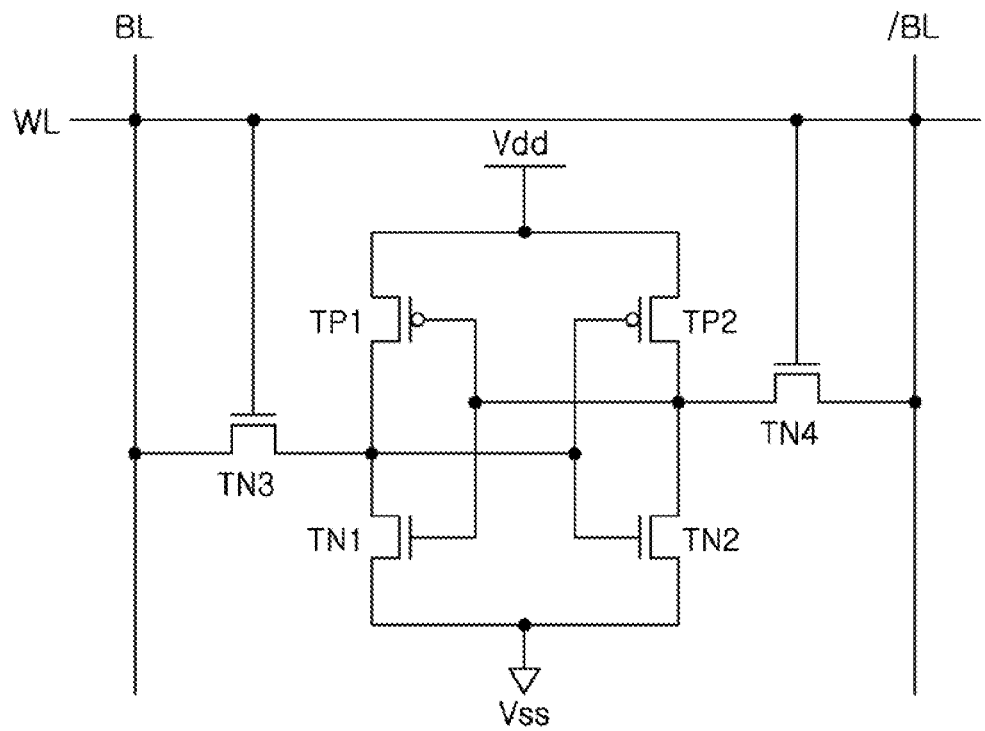
FIG. 19 is a circuit diagram of a static random access memory (SRAM) cell including a semiconductor device according to an example embodiment of the present disclosure.

Referring to FIGS. 18 and 19, a semiconductor device 200 according to an example embodiment of the present disclosure may include a semiconductor substrate 201 having a gate structure 240 in an active region ACT. In an example embodiment of the present disclosure, the active region ACT may include a fin-type active region FA.

The semiconductor substrate 201 employed in this example embodiment may be a monocrystalline silicon substrate. For example, the semiconductor substrate 201 may be a silicon substrate having (100) plane. In an example embodiment of the present disclosure, the semiconductor substrate 201 may be, for example, an SOI substrate, a Ge substrate, or a SiGe substrate.

The active region ACT may include, for example, silicon (Si) or SiGe. The active region ACT may be defined by a device separator 205. The semiconductor substrate 201 may include a well region doped with an impurity to form metal oxide semiconductor (MOS) transistors. In an example embodiment of the present disclosure, the semiconductor substrate 201 may include an n-type well for forming p-channel metal oxide semiconductor (PMOS) transistors.

The gate structure 240 may include a gate insulating layer 242 and a gate electrode 245 sequentially disposed in the active region ACT. The gate insulating layer 242 may include at least one of a silicon oxide layer, a silicon nitride layer, a silicon oxynitride layer, and a high-k dielectric layer. The nigh-k dielectric layer may include the above-mentioned insulating material having a dielectric constant greater than that of a silicon oxide layer.

The gate electrode 245 may be disposed on the gate insulating layer 242 and may traverse the active region ACT. The gate electrode 245 may be formed of, for example, a polycrystalline silicon layer doped with an impurity. In an example embodiment of the present disclosure, the gate electrode 245 may include a conductive material having relatively low resistivity and a high work function. For example, the gate electrode 245 may include at least one of metals, such as tungsten (W) and molybdenum (Mo), and conductive metal compounds, such as titanium nitride, tantalum nitride, tungsten nitride, and titanium aluminum nitride.

Spacers 250 may be disposed on both side walls of the gate structure 240. The spacers 250 may be, for example, a silicon oxide layer or a silicon nitride layer. Impurity regions 243 may be formed on portions of the active region ACT disposed at both sides of the gate structure 240. As illustrated in this example embodiment, in the case of a PMOS transistor, the impurity regions 243 may be doped with a p-type impurity such as boron (B).

Source/drain regions 210 may be obtained by forming recesses through selective etching of portions of the active region ACT disposed at both sides of the gate structure 240, and then forming SiGe epitaxial layers within the recesses using an SEG process. As illustrated in this example embodiment, in the case of a PMOS transistor, to apply compression stress to channel regions, SiGe epitaxial layers having a lattice constant greater than that of silicon included in the semiconductor substrate 201 may be formed.

The source/drain regions 210 may be formed of, for example, silicon germanium ($Si_{1-x}Ge_x$, 0<x<1). A lattice constant of Ge crystals may be greater than that of Si crystals, and thus as Si atoms are replaced by Ge atoms within a silicon crystalline lattice, a lattice constant of $Si_{1-x}Ge_x$ (0<x<1) may be greater than that of the si crystals. When the SiGe epitaxial, layers are grown in the recesses, compression stress may be generated in the channel regions of the PMOS transistor. As the concentration of Ge increases, the lattice of the SiGe epitaxial layers may become greater, and thus compression stress applied to the channel regions may increase.

Metal silicide layers 282 may be disposed on the source/drain regions 210. Process of forming the metal silicide layers 282 may include depositing metal layers on surfaces of the source/drain regions 210 first, then the metal layers may react with the SiGe epitaxial layers to form metal silicide layers containing germanium (Ge).

A first interlayer insulating layer 264 and a second interlayer insulating layer 266 may tee sequentially disposed on the semiconductor substrate 201. The first and second interlayer insulating layers 264 and 266 may be formed of the above-described material, and by a CVD process, a spin coating process, or the like. If necessary, the first interlayer insulating layer 264 may be formed, and then a process of planarizing the first interlayer insulating layer 264 may be performed. As illustrated in this example embodiment, prior to forming the first interlayer insulating layer 264, a first etch stop layer 273 may be conformally formed along surfaces of the gate structures 240 disposed on the semiconductor substrate 201, and a second etch stop layer 274 may be disposed between the first and second interlayer insulating layers 264 and 266. The first and second etch stop layers 273 and 274 may include, for example, a silicon nitride, a silicon oxynitride, or an aluminum nitride.

First contact plugs 280A connected to the source/drain regions 210 may be formed through the first interlayer insulating layer 264 so as to allow the metal silicide layers 282 to be connected to the source/drain regions 210. Each of the first contact plugs 280A may include a conductive material 266, and a conductive barrier layer 284 surrounding the conductive material 286. A second contact plug 280B may include elements similar to those of the first contact plugs 280A, and may be connected to the gate electrode 245 through the first and second interlayer insulating layers 264 and 266.

Upper surfaces of the first contact plugs 280A may be disposed on a level lower than that of an upper surface of the second contact plug 280B. The first and second contact plugs 280A and 280B may be formed up to planes having different levels, and thus a distance therebetween may be reduced. That is, the distance between the first contact plugs 280A and the second contact plug 280B at the level of the upper surfaces of the first contact plugs 280A may be reduced.

The second interlayer insulating layer 266 may have first metal lines 290A and a second metal line 290B disposed thereon. The second inter layer insulating layer 266 may include a low-k dielectric layer 268 formed around the first and second metal lines 290A and 290B and used in a damascene process. The first and second metal lines 290A and 290B may include, for example, copper (Cu) or a copper-containing alloy.

As illustrated in FIG. 18, the first metal lines 290A may have metal vias V disposed within the second interlayer insulating layer 266, and may be connected to the first contact plugs 280A through the metal vias V. Conversely, the second metal line 290B may be directly connected to the second contact plug 280B without a metal via. Thus, the present disclosure may reduce the number of metal vias while maintaining a layout design of the related art. As a result, the likelihood of contact defects due to a metal via may be reduced.

FIG. 19 is a circuit diagram of a static random access memory (SRAM) cell including a semiconductor device according to an example embodiment of the present, disclosure.

Referring to FIG. 19, the single cell in the SRAM device may include a first drive transistor TN1, a second drive transistor TN2, a first load transistor TP1, a second load transistor TP2, a first access transistor TN3, and a second access transistor TN4. Here, sources of the first and second drive transistors TN1 and TN2 may be connected to a ground power supply voltage VSS line, and sources of the first and second load transistors TP1 and TP2 may be connected to a power supply voltage VDD line.

The first drive transistor TN1, formed of an NMOS transistor, and the first load transistor TP1, formed of a PMOS transistor, may form a first inverter, and the second drive transistor TN2, formed of an NMOS transistor, and the second load transistor TP, formed of a PMOS field effect transistor, may form a second inverter. At least one of the first and second drive transistors TN1 and TN2, the first and second load transistors TP1 and TP2, and the first and second access transistors TN3 and TN4 may include a semiconductor device according to at least one of the example embodiments of the present disclosure described above with reference to FIGS. 1 through 2C and FIGS. 16 through 18.

Output terminals of the first and second inverters may be connected to sources of the first and second access transistors TN3 and TN4, respectively. In addition, input terminals and the output terminals of the first and second inverters may intersect each other so as to configure a single latch circuit. Drains of the first and second access transistors TN3 and TN4 may be connected to first and second bit line BL and/BL, respectively.

Figure 20:
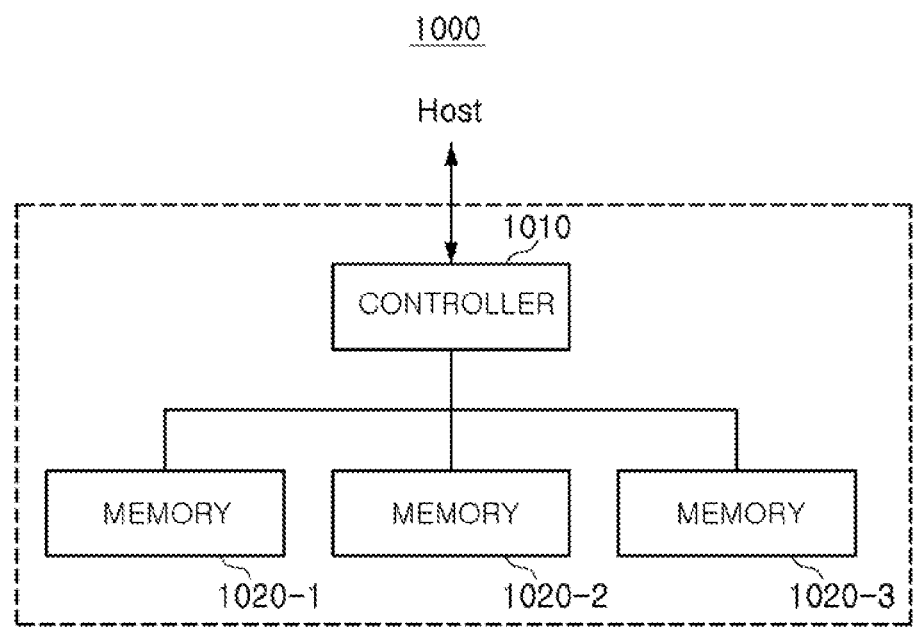
FIG. 20 is a block diagram of a storage device including a semiconductor device according to an exemplary embodiment of the present disclosure.

FIG. 20 is a block diagram of a storage device including a semiconductor device according to an example embodiment of the present disclosure.

Referring to FIG. 20, a storage device 1000, according to an example embodiment of the present disclosure, may include a controller 1010 communicating with a host and memories 1020-1, 1020-2, and 1020-3 storing data. The respective memories 1020-1, 1020-2, and 1020-3 may each include a semiconductor device according to at least, one of the example embodiments of the present disclosure described above with reference to FIGS. 1 through 2C and FIGS. 16 through 18.

The host communicating with the controller 1010 may be various types of electronic devices each of which the storage device 1000 may be embedded in. The host may be, for example, a smartphone, a digital camera, a desktop PC, a laptop PC, or a media player. The controller 1010 may receive a data writing or data reading request; transferred by the host, and may generate a command CMD for writing data to the memories 1020-1, 1020-2, and 1020-3 or reading data from the memories 1020-1, 1020-2, and 1020-3.

As illustrated in FIG. 20, one or more memories 1020-1, 1020-2, and 1020-3 may be connected to the controller 1010, in parallel within the storage device 1000. By connecting the memories 1020-1, 1020-2, and 1020-3 to the controller 1010 in parallel, the storage device 1000 having a large capacity, such as a solid state drive (SSD), may be implemented.

As set forth above, according to an example embodiment of the present disclosure, upper surfaces of adjacent contact plugs may be disposed on different levels, thereby reducing an interval, such as the distance d shown in FIG. 2A, between the adjacent contact plugs, for example, to about 10 nm or less. A portion of contact plugs may be directly connected to a metal line without using a via structure, thereby abating contact defects caused by a via. The interval is the shortest distance between the adjacent plugs, and may be located at a level which an upper surface of one of the adjacent plugs is disposed on.

While exemplary embodiments of the present disclosure have been shown and described above, it will be apparent to those skilled in the art that modifications and variations could be made without departing from the spirit and scope of the present disclosure, as defined by the appended claims.

What is claimed is:

1. A semiconductor device comprising:
   a substrate having an active region;
   a plurality of active fins protruding from the active region and extending in a first direction;
   a gate structure traversing the plurality of active fins and extending in a second direction intersecting the first direction;
   a source/drain region disposed in the plurality of active fins at a side of the gate structure;
   a first interlayer insulating layer and a second interlayer insulating layer sequentially disposed on the gate structure and the source/drain region;
   an etch stop layer disposed between the first interlayer insulating layer and the second interlayer insulating layer;
   a first contact plug connected to the source/drain region through the first interlayer insulating layer, and extending in the second direction;
   a second contact plug connected to the gate structure through the first interlayer insulating layer, the etch stop layer and the second interlayer insulating layer;
   a first metal line disposed on the second interlayer insulating layer, and having a metal via connected to a portion of the first contact plug through the second interlayer insulating layer and the etch stop layer; and
   a second metal line disposed on the second interlayer insulating layer, and directly connected to the second contact plug, wherein a level of an upper surface of the etch stop layer is higher than a level of an upper surface of the first contact plug, and is lower than a level of an upper surface of the second contact plug, and a width of the first contact plug in the second direction is greater than a width of the metal via in the second direction.

2. The semiconductor device of claim 1, wherein the width of the first contact plug in the second direction is larger than a width of the second contact plug in the second direction.

3. The semiconductor device of claim 1, wherein the metal via does not overlap the gate structure in a vertical direction.

4. The semiconductor device of claim 1, wherein the first metal line and the metal via are integrated with each other.

5. The semiconductor device of claim 1, wherein the etch stop layer comprises aluminum nitride (AlN).

6. The semiconductor device of claim 1, wherein the first contact plug comprises a metal silicide layer connected to the source/drain region.

7. The semiconductor device of claim 1, wherein the first contact plug and the second contact plug each comprises tungsten (W), cobalt (Co), an alloy thereof, or a combination thereof.

8. The semiconductor device of claim 1, wherein each of the first contact plug and the second contact plug comprises a conductive barrier layer disposed on lateral surfaces and a lower surface thereof.

9. The semiconductor device of claim 1, further comprising: a spacer disposed along lateral surfaces of each of the first contact plug and the second contact plug, wherein a top surface of the spacer along lateral surface of the first contact plug is coplanar with a top surface of the first interlayer insulating layer.

10. The semiconductor device of claim 1, wherein an interval between the first contact plug and the second contact plug is about 10 nm or less.

11. A semiconductor device comprising:
a substrate having an active region;
an active fin protruding from the active region and extending in a first direction;
a gate structure traversing the active fin and extending in a second direction intersecting the first direction;
a source/drain region disposed in the active fin at a side of the gate structure;
a first interlayer insulating layer and a second interlayer insulating layer sequentially disposed on the gate structure and the source/drain region;
an etch stop layer disposed between the first interlayer insulating layer and the second interlayer insulating layer;
a first contact plug connected to the source/drain region through the first interlayer insulating layer;
a second contact plug connected to the gate structure through the first interlayer insulating layer, the etch stop layer and the second interlayer insulating layer;
a first metal line disposed on the second interlayer insulating layer, and having a metal via connected to the first contact plug through the second interlayer insulating layer and the etch stop layer; and
a second metal line disposed on the second interlayer insulating layer, and directly connected to the second contact plug,
wherein a lower surface of the etch stop layer is coplanar with an upper surface of the first contact plug, but is positioned at a level that is different from a level of an upper surface of the second contact plug, and
a width of the first contact plug in the second direction is greater than a width of the metal via in the second direction.

12. The semiconductor device of claim 11, wherein the active fin comprises a plurality of active fins arranged in the second direction, the source/drain region is disposed on adjacent active fins of the plurality of active fins, and the first contact plug is disposed on the source/drain region and extends in the second direction.

13. The semiconductor device of claim 12, wherein the metal via is disposed on a portion of the second contact plug, and the width of the first contact plug in the second direction is larger than a width of the second contact plug in the second direction.

14. The semiconductor device of claim 11, wherein the etch stop layer comprises aluminum nitride (AlN) and at least one of the first and second interlayer insulating layers comprises silicon oxide.

15. The semiconductor device of claim 11, wherein the upper surface of the first contact plug is coplanar with an upper surface of the first interlayer insulating layer.

16. The semiconductor device of claim 11, wherein the upper surface of the second contact plug is coplanar with an upper surface of the second interlayer insulating layer.

* * * * *